(12) United States Patent
Chin et al.

(10) Patent No.: US 12,255,144 B2
(45) Date of Patent: Mar. 18, 2025

(54) GRAPHENE LINERS AND CAPS FOR SEMICONDUCTOR STRUCTURES

(71) Applicant: Taiwan Semiconductor Manufacturing Company Limited, Hsinchu (TW)

(72) Inventors: Shu-Cheng Chin, Hsinchu (TW); Chih-Yi Chang, New Taipei (TW); Chih-Chien Chi, Hsinchu (TW); Ming-Hsing Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 575 days.

(21) Appl. No.: 17/647,624

(22) Filed: Jan. 11, 2022

(65) Prior Publication Data

US 2023/0154850 A1    May 18, 2023

Related U.S. Application Data

(60) Provisional application No. 63/263,959, filed on Nov. 12, 2021.

(51) Int. Cl.
*H01L 23/532*    (2006.01)
*H01L 21/768*    (2006.01)
*H01L 23/522*    (2006.01)

(52) U.S. Cl.
CPC .. *H01L 23/53238* (2013.01); *H01L 21/76804* (2013.01); *H01L 21/7684* (2013.01); *H01L 21/76846* (2013.01); *H01L 21/76877* (2013.01); *H01L 23/5226* (2013.01)

(58) Field of Classification Search
CPC ........... H01L 21/76804; H01L 21/7684; H01L 21/76846; H01L 21/76877; H01L 23/53238; H01L 23/5226
USPC ........................................................ 257/435
See application file for complete search history.

(56) References Cited

U.S. PATENT DOCUMENTS

| | | | |
|---|---|---|---|
| 2014/0145332 A1* | 5/2014 | Ryan | H01L 21/76849 438/653 |
| 2014/0284802 A1* | 9/2014 | Sakata | H01L 23/53257 257/750 |
| 2015/0137377 A1* | 5/2015 | Bao | H01L 21/76849 257/758 |
| 2018/0350913 A1* | 12/2018 | Yang | H01L 21/76879 |
| 2021/0057335 A1* | 2/2021 | Yang | H01L 23/5226 |
| 2022/0216101 A1* | 7/2022 | Meng | H01L 21/76844 |

* cited by examiner

*Primary Examiner* — Igwe U Anya
(74) *Attorney, Agent, or Firm* — Harrity & Harrity, LLP

(57) ABSTRACT

A graphene liner deposited between at least one liner material (e.g., barrier layer, ruthenium liner, and/or cobalt liner) and a copper conductive structure reduces surface scattering at an interface between the at least one liner material and the copper conductive structure. Additionally, or alternatively, the carbon-based liner reduces contact resistance at an interface between the at least one liner material and the copper conductive structure. A carbon-based cap may additionally or alternatively be deposited on a metal cap, over the copper conductive structure, to reduce surface scattering at an interface between the metal cap and an additional copper conductive structure deposited over the metal cap.

20 Claims, 39 Drawing Sheets

GRAPHENE LINERS AND CAPS FOR SEMICONDUCTOR STRUCTURES

CROSS-REFERENCE TO RELATED APPLICATION

This Patent application claims priority to U.S. Provisional Patent Application No. 63/263,959, filed on Nov. 12, 2021, and entitled "GRAPHENE LINERS AND CAPS FOR SEMICONDUCTOR STRUCTURES." The disclosure of the prior Application is considered part of and is incorporated by reference into this Patent Application.

BACKGROUND

Some electronic devices, such as a processor, a memory device, or another type of electronic device, include a middle end of line (MEOL) region that electrically connects transistors in a front end of line (FEOL) region to a back end of line (BEOL) region. The BEOL region or MEOL region may include a dielectric layer and via plugs formed in the dielectric layer. A plug may include one or more metals for electrical connection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
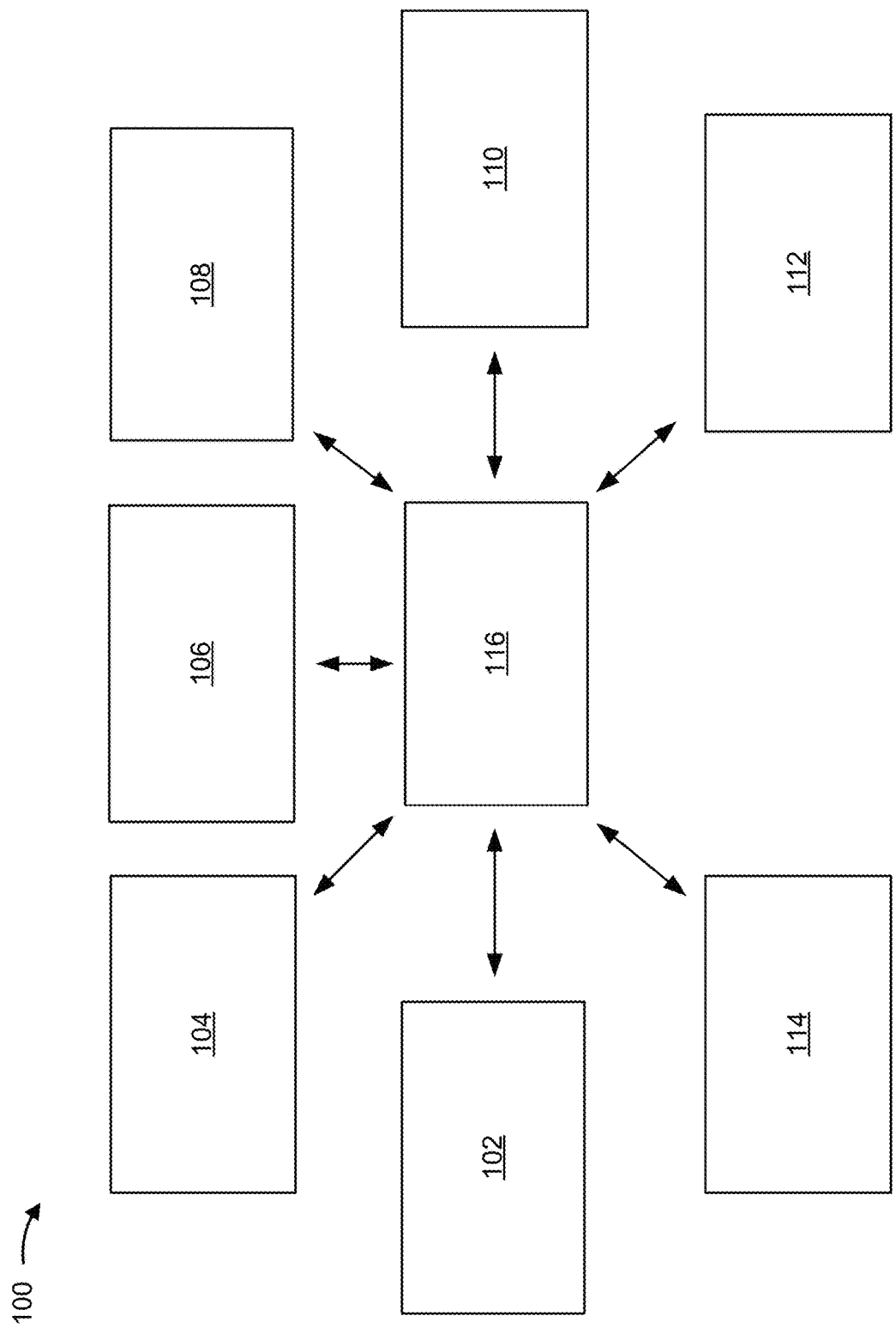
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, an MEOL region may electrically connect semiconductor structures in an FEOL region of an electronic device to a BEOL region of the electronic device. The BEOL region may electrically connect the contact plugs of the MEOL region to interconnects or other conductive structures (such as metallization layers, also referred to as wires, or vias). The metallization layers (e.g., copper, cobalt, ruthenium, or another metal) may contact each other (or the contact plugs) at metal interfaces.

Copper is often used for BEOL metallization layers and vias (or for MEOL contact plugs) due to low contact resistance and sheet resistance relative to other conductive materials, such as aluminum (Al). Lower resistivity provides lower resistance/capacitance (RC) time constants and faster propagation of signals across an electronic device. However, copper also has a high diffusion (or electromigration) rate, which can cause copper atoms to diffuse into surrounding dielectric material. This diffusion causes an increase in resistivity for BEOL metallization layers and vias (or for MEOL contact plugs), which can decrease electrical performance of an electronic device. Moreover, diffusion may result in copper atoms migrating into other MEOL layers and/or FEOL layers, which can cause semiconductor device failures and reduced manufacturing yield.

Accordingly, barrier layers (such as titanium nitride (TiN), tantalum nitride (TaN), and/or another type of barrier layer) may be deposited to prevent diffusion. However, the barrier layers increase contact resistance when deposited at the metal interface, which again decreases electrical performance of the electronic device. Therefore, a metal liner (such as cobalt (Co), ruthenium (Ru), or a combination thereof) may be deposited instead of a barrier layer or may be used in combination with a thinner barrier layer in order to reduce contact resistance. However, the metal layer may cause surface scattering at an interface with the copper. Increased surface scattering can decrease electrical performance of an electronic device.

Some implementations described herein provide a bi-layer liner including graphene adjacent to a copper conductive structure. The graphene therefore reduces surface scattering at an interface between at least one metal of the bi-layer liner and the copper conductive structure. Additionally, or alternatively, the bi-layer liner may include a barrier layer formed between the copper conductive structure and a surrounding dielectric. Accordingly, in some implementations, the graphene therefore reduces contact resistance at an interface between the barrier layer and the copper conductive structure.

Additionally, or alternatively, some implementations described herein provide a bi-layer cap including graphene that is formed over a copper conductive structure. The graphene therefore reduces surface scattering at an interface between a metal of the bi-layer cap and an additional copper conductive structure deposited over the cap.

FIG. 1 is a diagram of an example environment 100 in which systems and/or methods described herein may be implemented. The example environment 100 includes semiconductor processing tools that can be used to form semiconductor structures and devices, such as a conductive structure as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
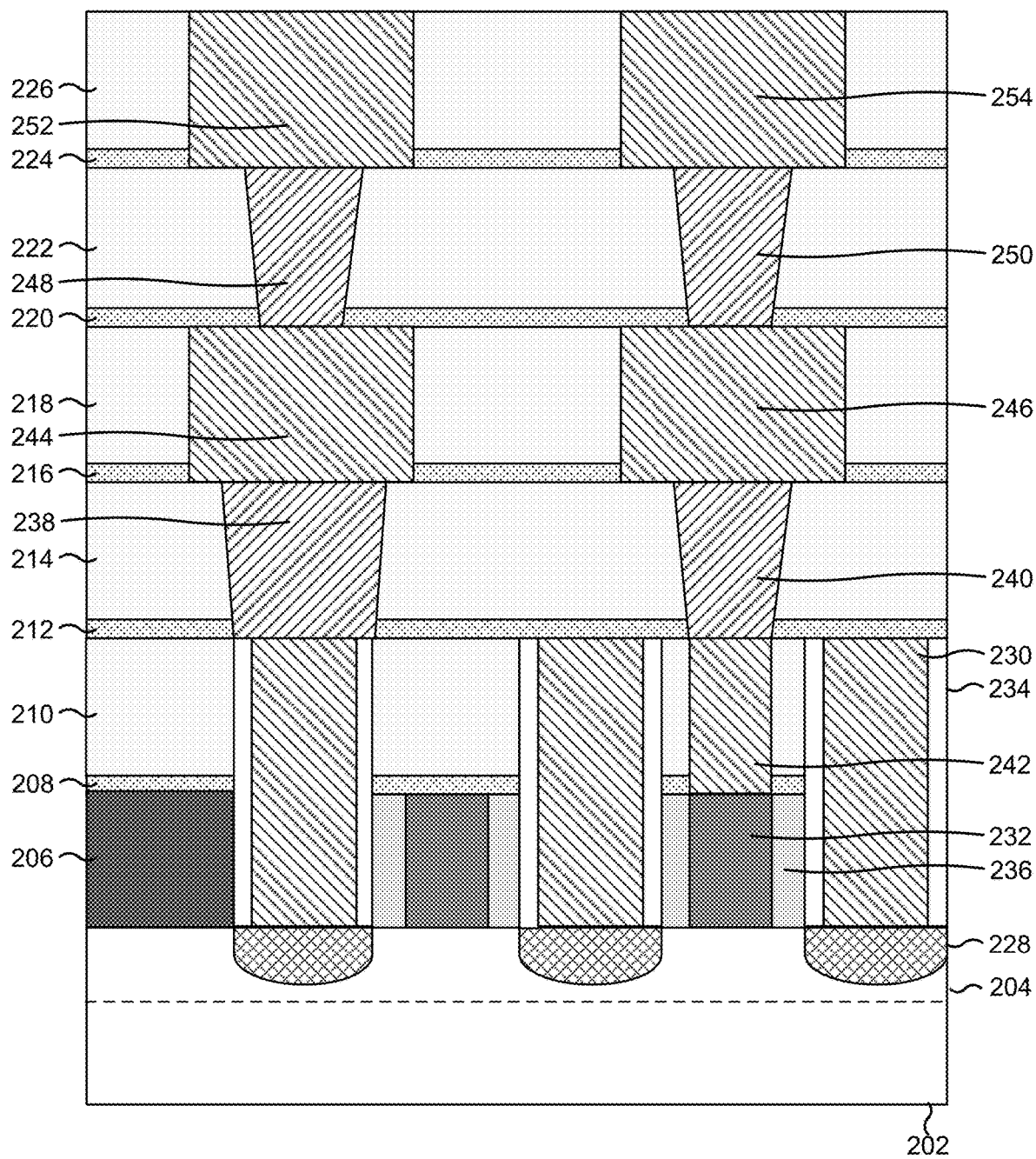
FIG. 2 is a diagram of an example semiconductor structure described herein.

FIG. 2 is a diagram of a portion of an example device 200 described herein. Device 200 includes an example of a memory device, a logic device, a processor, an input/output device, or another type of semiconductor device that includes one or more transistors.

The device 200 includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 include a silicon nitride (SiNx), an oxide (e.g., a silicon oxide (SiOx) and/or another oxide material), and/or another type of dielectric material. The ESLs 208, 212, 216, 220, 224 includes a layer of material that is configured to permit various portions of the device 200 (or the layers included therein) to be selectively etched or protected from etching to form one or more of the structures included in the device 200.

As further shown in FIG. 2, the device 200 includes a plurality of epitaxial (epi) regions 228 that are grown and/or otherwise formed on and/or around portions of a fin structure 204 of a substrate 202. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the device 200.

The epitaxial regions 228 are electrically connected to metal source or drain contacts 230 of the transistors included in the device 200. The metal source or drain contacts (MDs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. In some implementations, the gates 232 may comprise multiple layers of material, such as multiple layers of metal or multiple layers including at least one polysilicon layer and at least one metal layer, among other examples. The metal source or drain contacts 230 and the gates 232 are electrically isolated by one or more sidewall spacers, including spacers 234 on each side of the metal source or drain contacts 230 and spacers 236 on each side of the gate 232. The spacers 234 and 236 include a silicon oxide (SiOx), a silicon nitride (SiXNy), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the device 200 and/or electrically connect the transistors to other areas and/or components of the device 200. In some implementations, the interconnects electrically connect the transistors to a back end of line (BEOL) region of the device 200.

The metal source or drain contacts 230 are electrically connected to source or drain interconnects 238 (e.g., source or drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of MEOL and BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the device 200 includes additional metallization layers and/or vias that connect the device 200 to a package.

As indicated above, FIG. 2 is provided as an example. Other examples may differ from what is described with regard to FIG. 2.

Figure 3:
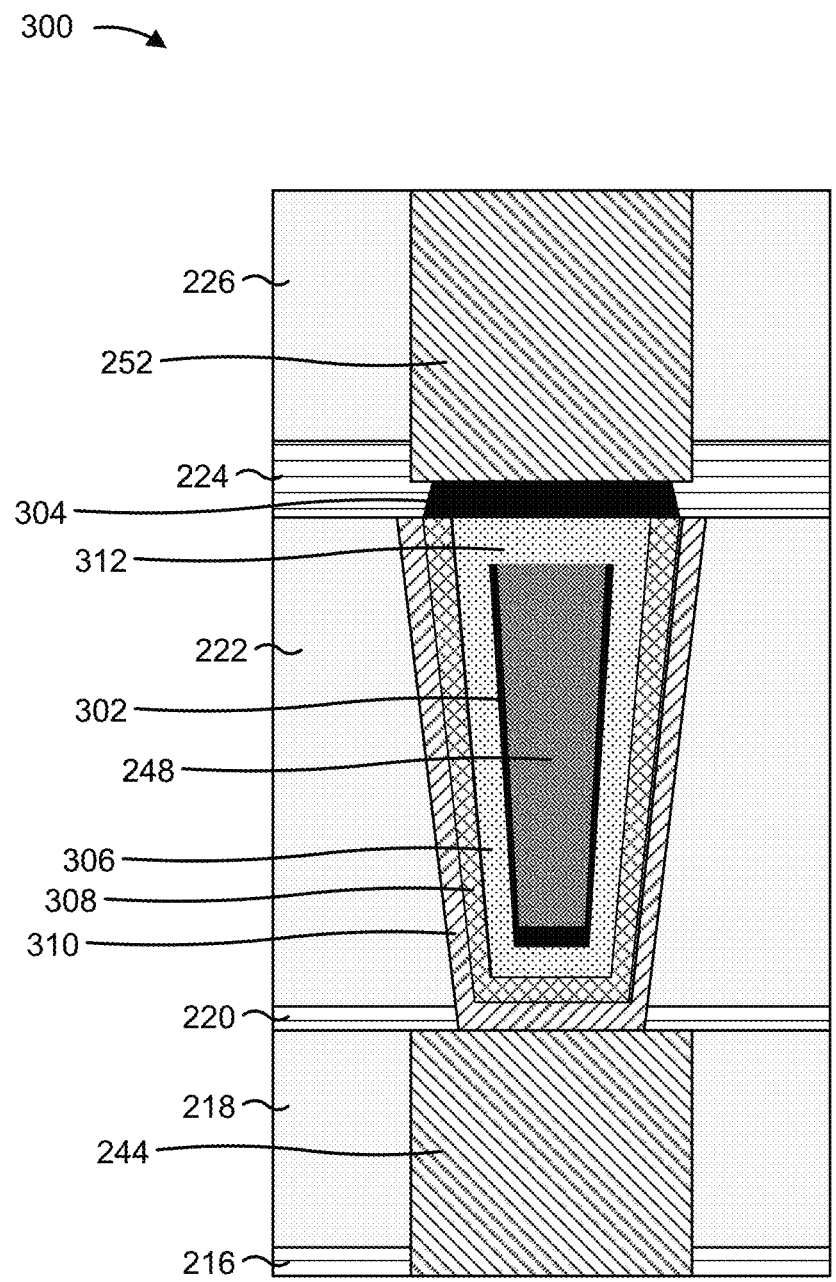
FIG. 3 is a diagram of an example conductive structure described herein.

FIG. 3 is a diagram of an example semiconductor structure 300 described herein. The semiconductor structure 300 includes a conductive structure 248 (also referred to as "via 248") that is formed with a graphene liner 302 and a graphene cap 304. The graphene liner 302 may be implemented with or without the graphene cap 304. Similarly, the graphene cap 304 may be implemented with or without the graphene liner 302. As used herein, "graphene" may refer to a single, two-dimensional sheet of carbon atoms or to a few two-dimensional sheets of carbon atoms stacked together. In some implementations, the graphene liner 302 includes no more than seven two-dimensional sheets of carbon atoms and may have a thickness no more than 20 Angstroms (Å). For example, the graphene liner 302 may include three, four, five, or six two-dimensional sheets of carbon atoms.

As shown in FIG. 3, the conductive structure 248 may connect a conductive structure 244 (e.g., part of an M0 metallization layer) to a conductive structure 252 (e.g., a M1 metallization layer). Although described with respect to using a graphene cap and/or a graphene liner in the conductive structure 248, the description similarly applies to using a graphene cap and/or a graphene liner in an M0 metallization layer (e.g., conductive structure 244) and/or in higher metallization layers (e.g., an M1 metallization layer, such as in conductive structure 252). Similarly, although described with respect to using a graphene cap and/or a graphene liner in the conductive structure 248 above a source or drain contact 230, the description similarly applies to using a graphene cap and/or a graphene liner in a conductive structure above a gate contact 242 (e.g., conductive structure 240, conductive structure 246, via 250, and/or conductive structure 254, among other examples).

As shown in FIG. 3, the conductive structure 244 may be formed in a dielectric layer 218. For example, the dielectric layer 218 may include silicon oxycarbide (SiOC). Although not shown, the conductive structure 244 may contact an interconnect 238 that is formed in a dielectric layer 214 below an ESL 216. The ESL 216 may include aluminum oxide ($Al_2O_3$), aluminum nitride (AlN), silicon nitride (SiN), silicon oxynitride (SiOxNy), aluminum oxynitride (AlON), and/or a silicon oxide (SiOx). In some implementations, the ESL 216 includes a plurality of ESL layers stacked together to function as an etch stop.

As further shown in FIG. 3, the conductive structure 248 may be formed in a dielectric layer 222 above an ESL 220. The dielectric layer 222 may include silicon oxycarbide (SiOC), and the ESL 220 may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, the ESL 220 includes a plurality of ESL layers stacked together to function as an etch stop.

In some implementations, the conductive structure 248 is formed in a recess (e.g., recess 402 as described in connection with FIGS. 4A-4M and/or 6A-6L or recess 502/504 as described in connection with FIGS. 5A-5I). Sidewalls of the recess may form an angle from approximately 84 degrees to approximately 90 degrees. Selecting an angle of at least 84 degrees allows the conductive structure 248 to remain relatively narrow and conduct current faster. Selecting an angle of no more than 90 degrees allows for formation of material on sidewalls of the recess. Accordingly, a ratio of a width at the top of the recess to a width at the bottom of the recess may be from approximately 1.03 to approximately 1.2.

As further shown in FIG. 3, the conductive structure 248 may be adjacent to the graphene liner 302. The graphene liner 302 may have a thickness from approximately 2 Å to approximately 10 Å. Selecting a thickness of at least 2 Å reduces surface scattering between the copper of the conductive structure 248 and one or more liner materials (e.g., cobalt liner 306, ruthenium liner 308, and/or barrier layer 310, described in greater detail below). As a result, electrical performance of the conductive structure 248 is improved. Selecting a thickness of no more than 10 Å prevents the graphene liner 302 from significantly increasing the contact resistance between the conductive structure 248 and the conductive structure 244.

In some implementations, the graphene liner 302 is adjacent to the cobalt liner 306. The cobalt liner 306 reduces sheet resistance of the conductive structure 248. A ratio of a thickness of the cobalt liner 306 to a thickness of the graphene liner 302 may be in a range from approximately two to approximately twenty. Selecting a ratio of at least two ensures that the graphene liner 302 is thin enough such that the contact resistance between the conductive structure 248 and the conductive structure 244 is not significantly increased and/or the cobalt liner 306 is thick enough to reduce sheet resistance of the conductive structure 248. Selecting a ratio of no more than twenty ensures that the graphene liner 302 is thick enough such that the surface scattering between the copper of the conductive structure 248 and one or more liner materials is reduced and/or the cobalt liner 306 is thin enough such that too many cobalt atoms do not diffuse from the cobalt liner 306. For example, the cobalt liner 306 may have a thickness from approximately 5 Å to approximately 25 Å.

The cobalt liner 306 may optionally be omitted, as shown in FIGS. 6A-6L. Omitting the cobalt liner 306 allows more volume of the recess to be occupied by copper of the conductive structure 248, which reduces resistivity of the conductive structure 248. Additionally, omitting the cobalt liner 306 prevents diffusion of cobalt atoms.

Additionally, or alternatively, the graphene liner 302 is adjacent to the ruthenium liner 308. In implementations with the cobalt liner 306, the ruthenium liner 308 helps prevent diffusion of cobalt atoms from the cobalt liner 306 to other layers. In implementations without the cobalt liner 306, the ruthenium liner 308 reduces surface scattering for the conductive structure 248. A ratio of a thickness of the ruthenium liner 308 to a thickness of the graphene liner 302 may be in a range from approximately two to approximately twenty. Selecting a ratio of at least two ensures that the graphene liner 302 is thin enough such that the contact resistance between the conductive structure 248 and the conductive structure 244 is not significantly increased and/or the ruthenium liner 308 is thick enough to prevent cobalt diffusion or reduce surface scattering for the conductive structure 248. Selecting a ratio of no more than twenty ensures that the graphene liner 302 is thick enough such that the surface scattering between the copper of the conductive structure 248 and one or more liner materials is reduced and/or the ruthenium liner 308 is thin enough such that the sheet resistance of the conductive structure 248 is not significantly increased. For example, the ruthenium liner 308 may have a thickness from approximately 5 Å to approximately 25 Å.

The ruthenium liner 308 may optionally be omitted, such as when the barrier layer 310 is used. Omitting the ruthenium liner 308 allows more volume of the recess to be occupied by copper of the conductive structure 248, which reduces resistivity of the conductive structure 248. Additionally, omitting the ruthenium liner 308 reduces sheet resistance of the conductive structure 248. As an alternative, the ruthenium liner 308 may be used in combination with, or as an alternative to, the barrier layer 310.

Additionally, or alternatively, the graphene liner 302 is adjacent to the barrier layer 310. The barrier layer 310 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 310 helps prevent diffusion of copper atoms from the conductive structure 248 to other layers. A ratio of a thickness of the barrier layer 310 to a thickness of the graphene liner 302 may be in a range from approximately two to approximately twenty. Selecting a ratio of at least two ensures that the graphene liner 302 is thin enough such that the contact resistance between the conductive structure 248 and the conductive structure 244 is not significantly increased and/or the barrier layer 310 is thick enough to prevent copper diffusion. Selecting a ratio of no more than twenty ensures that the graphene liner 302 is thick enough such that the surface scattering between the copper of the conductive structure 248 and one or more liner materials is reduced and/or the barrier layer 310 is thin enough such that the contact resistance between the conductive structure 248 and the conductive structure 244 is not significantly increased. For example, the barrier layer 310 may have a thickness from approximately 5 Å to approximately 20 Å.

In some implementations, the barrier layer 310 is doped with ruthenium. For example, the barrier layer 310 may be doped with ruthenium when the ruthenium liner 308 is omitted. Accordingly, the barrier layer 310 may at least partially perform the functions of the ruthenium liner 308 described herein.

The barrier layer 310 may optionally be omitted, such as when the ruthenium liner 308 is used apart from, rather than in combination with, the barrier layer 310. Omitting the barrier layer 310 reduces the contact resistance between the conductive structure 248 and the conductive structure 244.

Accordingly, the conductive structure 248 includes a bi-layer liner with the graphene layer 302 and one or more of the cobalt liner 306, the ruthenium liner 308, and/or the barrier layer 310.

The trench including the conductive structure 248, the graphene liner 302, the cobalt liner 306, the ruthenium liner 308, and/or the barrier layer 310 has a depth that may be approximately equal to a thickness of the dielectric layer 222. A ratio of the depth to a thickness of the ESL 224 may be in a range from approximately two to approximately four. Selecting a ratio of at least two ensures that a sufficient volume of the recess is occupied by copper of the conductive structure 248 to reduce resistivity of the conductive structure 248 and/or the ESL 224 is not too thick to prevent the conductive structure 252 from being formed through the ESL 224. Selecting a ratio no more than four conserves a volume of copper used to form the conductive structure 248 and/or ensures that the ESL 224 is not too thin to stop unwanted etching through the ESL 224 and into the dielectric layer 222. For example, the depth may be in a range from approximately 200 Å to approximately 300 Å, and the thickness of the ESL 224 may be in a range from approximately 80 Å to approximately 120 Å.

As further shown in FIG. 3, the conductive structure 248 may be below a cobalt cap 312 such that the conductive structure 248 electrically interfaces with the conductive structure 252 through the cobalt cap 312. The cobalt cap 312 prevents diffusion of copper from the conductive structure 248. A ratio of a thickness of the cobalt cap 312 to a thickness of the barrier layer 310 (or a thickness of the ruthenium liner 308 or a thickness of the cobalt liner 306) may be in a range from approximately 0.2 to approximately 1.4. Selecting a ratio of at least 0.2 ensures that the cobalt cap 312 is thick enough to prevent copper diffusion and/or the barrier layer 310 is not too thick to significantly increase contact resistance between the conductive structure 248 and the conductive structure 244. Selecting a ratio of no more than 1.4 ensures that too many cobalt atoms do not diffuse from the cobalt cap 312 and/or the barrier layer 310 is thick enough to prevent copper diffusion. For example, the cobalt cap 312 may have a thickness in a range from approximately 5 Å to approximately 35 Å.

Although described as cobalt, ruthenium may be used in addition to, or in lieu of, cobalt for the cap. Ruthenium improves flow of copper more than cobalt but also increases sheet resistance of the conductive structure 248 more than cobalt. Additionally, ruthenium does not diffuse like cobalt atoms do.

As shown in FIG. 3, the cobalt cap 312 may be adjacent to the graphene cap 304. The graphene cap 304 prevents diffusion of cobalt atoms and reduces surface scattering between the cobalt cap 312 and the conductive structure 252. A ratio of a thickness of the cobalt cap 312 to a thickness of the graphene cap 304 may be in a range from approximately two to approximately twenty. Selecting a ratio of at least two ensures that the graphene cap 304 is thin enough such that the contact resistance between the conductive structure 248 and the conductive structure 252 is not significantly increased and/or the cobalt cap 312 is thick enough to prevent diffusion of copper from the conductive structure 248. Selecting a ratio of no more than twenty ensures that the graphene cap 304 is thick enough such that the surface scattering between the copper of the conductive structure 252 and the cobalt cap 312 is reduced and/or too many cobalt atoms do not diffuse from the cobalt cap 312. For example, the graphene cap 304 may have a thickness from approximately 2 Å to approximately 10 Å.

Accordingly, the conductive structure 248 includes a bi-layer cap with the graphene cap 304 and the cobalt cap 312 and/or a ruthenium cap.

The graphene liner 302 may be used in additional with, or in lieu of, the graphene cap 304. Using only a graphene liner 302 or only a graphene cap 304 reduces time and materials consumed during formation of the conductive structure 248.

The conductive structure 248 may electrically connect to the conductive structure 252 that is formed in a dielectric layer 226 above an ESL 224. The dielectric layer 226 may include silicon oxycarbide (SiOC), and the ESL 224 may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, the ESL 224 includes a plurality of ESL layers stacked together to function as an etch stop.

As indicated above, FIG. 3 is provided as an example. Other examples may differ from what is described with regard to FIG. 3.

FIGS. 4A-4M are diagrams of an example implementation 400 described herein. Example implementation 400 may be an example process for forming a conductive structure 248 with a graphene liner 302 and a graphene cap 304. The graphene liner 302 and the graphene cap 304 reduce contact resistance, which increases electrical performance of an electronic device including the conductive structure 248. Additionally, the graphene liner 302 results in more symmetric formation of the conductive structure 248, which reduces surface scattering of the conductive structure 248, and the graphene cap 304 results in more symmetric formation of the conductive structure 252, which reduces surface scattering of conductive structure 252.

Although described with both the graphene liner 302 and the graphene cap 304, the graphene liner 302 may be used without the graphene cap 304, or the graphene cap 304 may be used without the graphene liner 302. Using only a graphene liner 302 or only a graphene cap 304 reduces time and materials consumed during formation of the conductive structure 248.

Figure 4A:
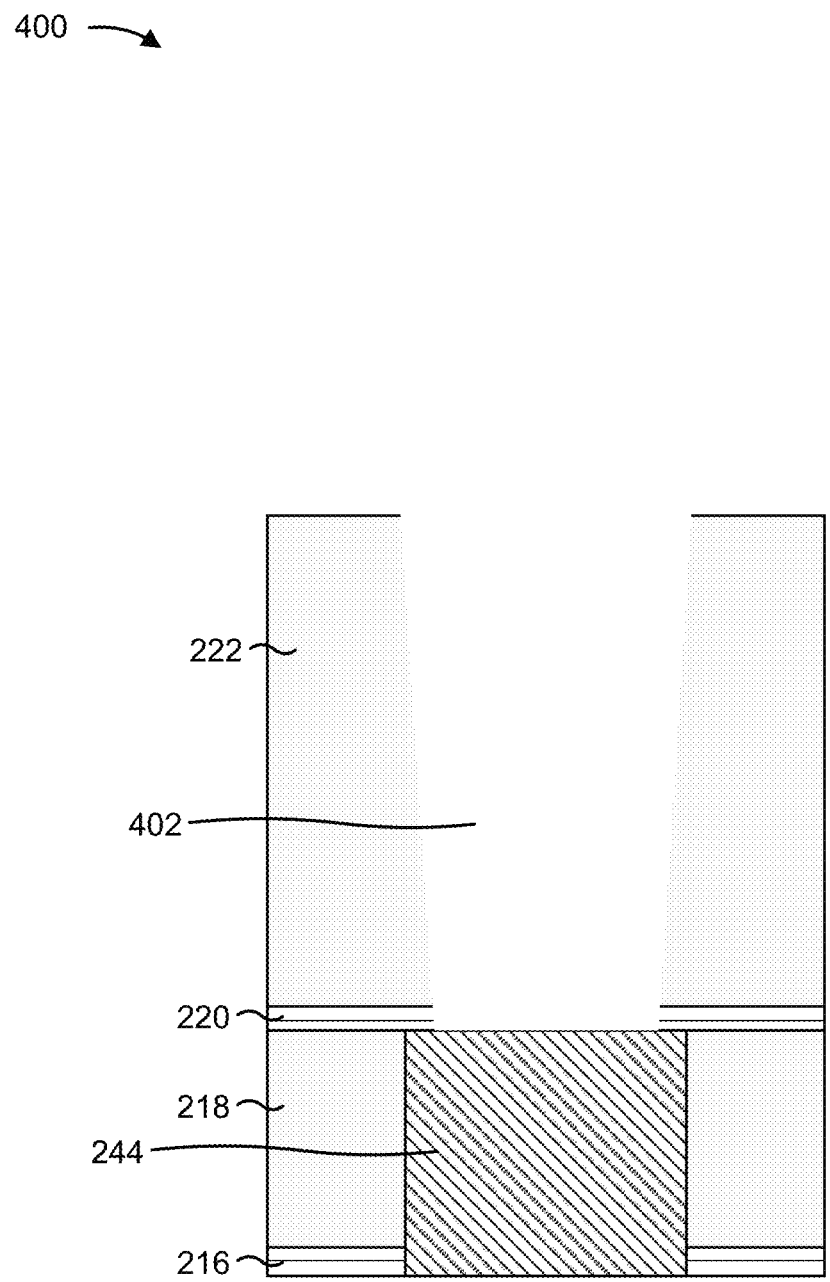
FIGS. 4A-4M are diagrams of an example implementation described herein.

As shown in FIG. 4A, the example process for forming the conductive structure 248 may be performed in connection with an MEOL. In some implementations, the MEOL includes a conductive structure 244 formed in a dielectric layer 218 that is above an ESL 216.

An ESL 220 may be formed over the dielectric layer 218 and the conductive structure 244. The deposition tool 102 may deposit the ESL 220 by a CVD technique, a PVD technique, an ALD technique, or another type of deposition technique. The planarization tool 110 may planarize the ESL 220 after the ESL 220 is deposited.

A dielectric layer 222 may be formed over the ESL 220. For example, the deposition tool 102 may deposit the dielectric layer 222 by a CVD technique, a PVD technique, an ALD technique, or another type of deposition technique. The planarization tool 110 may planarize the dielectric layer 222 after the dielectric layer 222 is deposited.

As further shown in FIG. 4A, the dielectric layer 222 may be etched to form an opening (resulting in recess 402) such that the conductive structure 244 is at least partially exposed. For example, the deposition tool 102 may form a photoresist layer on the dielectric layer 222 (or on an ESL formed on the dielectric layer 222, such as ESL 224), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 222 to form the recess 402. In some implementations, a photoresist removal tool removes the remaining portions of the photoresist layer (e.g., using a chemical stripper, a plasma asher, and/or another technique) after the etch tool 108 etches the recess 402.

Figure 4B:
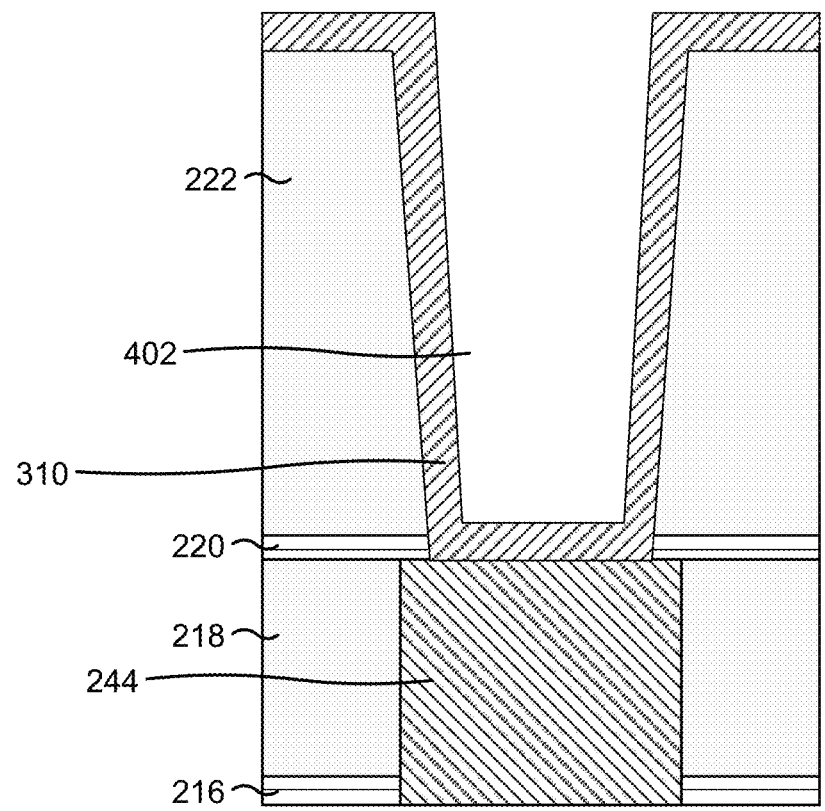

As shown in FIG. 4B, a barrier layer 310 may be formed over the exposed surface of the conductive structure 244 and sidewalls of the recess 402. The deposition tool 102 may deposit the barrier layer 310 by a CVD technique, a PVD technique, an ALD technique, or another type of deposition technique. In some implementations, and as shown in FIG. 4B, the barrier layer 310 is deposited on the dielectric layer 222 as well. In some implementations, the deposition tool 102 deposits the barrier layer 310 for an amount of time in a range from approximately 1 minute to approximately 10 minutes. Selecting at least 1 minute ensures that the barrier layer 310 is thick enough to prevent diffusion of copper from conductive structure 248. Selecting no more than 10 minutes ensures that the barrier layer 310 is not too thick so as to significantly increase contact resistance between conductive structure 244 and conductive structure 248.

Figure 4C:
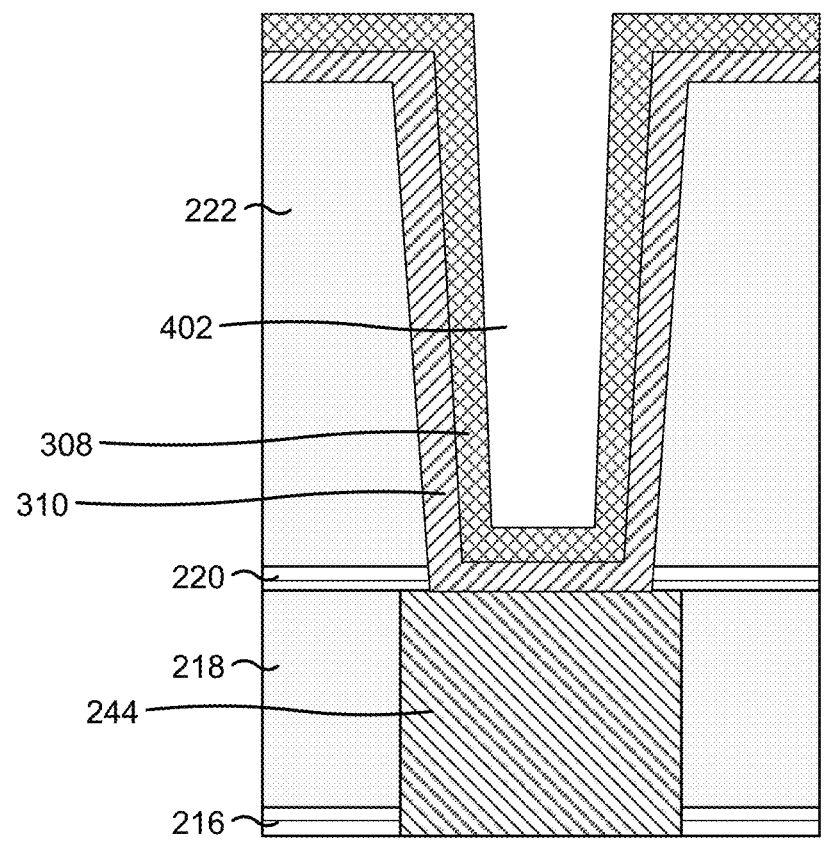

As shown in FIG. 4C, a ruthenium liner 308 may be formed over the barrier layer 310. The deposition tool 102 may deposit the ruthenium liner 308 by a CVD technique, a PVD technique, an ALD technique, or another type of deposition technique. In some implementations, and as shown in FIG. 4C, the ruthenium liner 308 is deposited over the dielectric layer 222 as well. In some implementations, the deposition tool 102 deposits the ruthenium liner 308 for an amount of time in a range from approximately 1 minute to approximately 10 minutes. Selecting at least 1 minute ensures that the ruthenium liner 308 is thick enough to reduce surface scattering of conductive structure 248. Selecting no more than 10 minutes ensures that the ruthenium liner 308 is not too thick so as to significantly increase sheet resistance of conductive structure 248. In implementation 400, the ruthenium liner 308 is used in combination with the barrier layer 310. In other implementations, the ruthenium liner 308 is used without the barrier layer 310 in order to further reduce contact resistance between conductive structure 244 and conductive structure 248. In other implementations, the barrier layer 310 is used without the ruthenium liner 308 in order to further reduce sheet resistance of conductive structure 248. In such implementations, the barrier layer 310 may be doped with ruthenium in order to reduce surface scattering of conductive structure 248. For example, the ion implantation tool 114 may dope the barrier layer 310 with ruthenium ions.

Figure 4D:
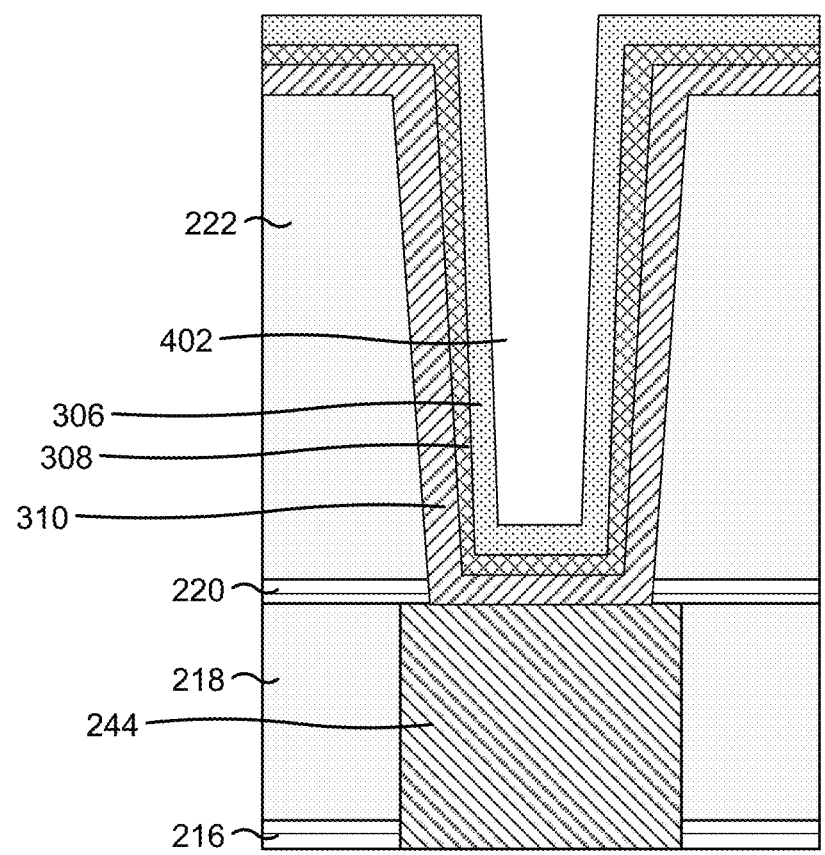

As shown in FIG. 4D, a cobalt liner 306 may be formed over the ruthenium liner 308. The deposition tool 102 may deposit the cobalt liner 306 by a CVD technique, a PVD technique, an ALD technique, or another type of deposition technique. In some implementations, and as shown in FIG. 4D, the cobalt liner 306 is deposited over the dielectric layer 222 as well. In some implementations, the deposition tool 102 deposits the cobalt liner 306 for an amount of time in a range from approximately 1 minute to approximately 10 minutes. Selecting at least 1 minute ensures that the cobalt liner 306 is thick enough to reduce sheet resistance of conductive structure 248. Selecting no more than 10 minutes ensures that the cobalt liner 306 is not too thick so as to cause diffusion of too many cobalt atoms. In implementation 400, the cobalt liner 306 is used in combination with the ruthenium liner 308. In other implementations, the cobalt liner 306 is used without the ruthenium liner 308 (and thus is deposited on the barrier layer 310) in order to further reduce sheet resistance of conductive structure 248. In other implementations, the cobalt liner 306 is omitted in order to prevent diffusion of cobalt atoms.

Figure 4E:
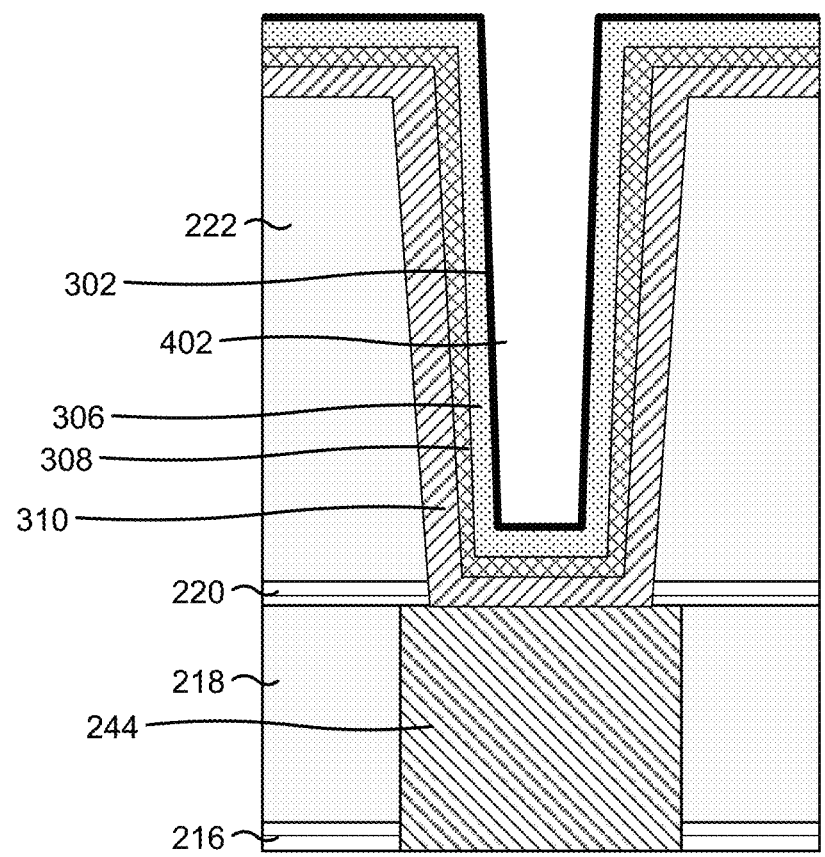

As shown in FIG. 4E, a graphene liner 302 may be formed over the cobalt liner 306. The deposition tool 102 may deposit the graphene liner 302 by a CVD technique, a PVD technique, an ALD technique, or another type of deposition technique. In some implementations, and as shown in FIG. 4E, the graphene liner 302 is deposited over the dielectric layer 222 as well. In some implementations, a ratio of a deposition time associated with the graphene liner 302 to a deposition time associated with the barrier layer 310, the ruthenium liner 308, or the cobalt liner 306 is in a range from approximately one to approximately two. Selecting a ratio of at least one ensures that the graphene liner 302 is thick enough to reduce surface scattering of the conductive structure 244. Selecting a ratio of no more than two ensures that the graphene liner 302 is not so thick as to significantly increase contact resistance between conductive structure 244 and conductive structure 248. For example, the deposition tool 102 deposits the graphene liner 302 for an amount of time in a range from approximately 4 minutes to approximately 18 minutes.

Accordingly, a bi-layer liner is formed with a first layer including the graphene layer 302 and a second layer including the cobalt liner 306 and the barrier layer 310.

Figure 4F:
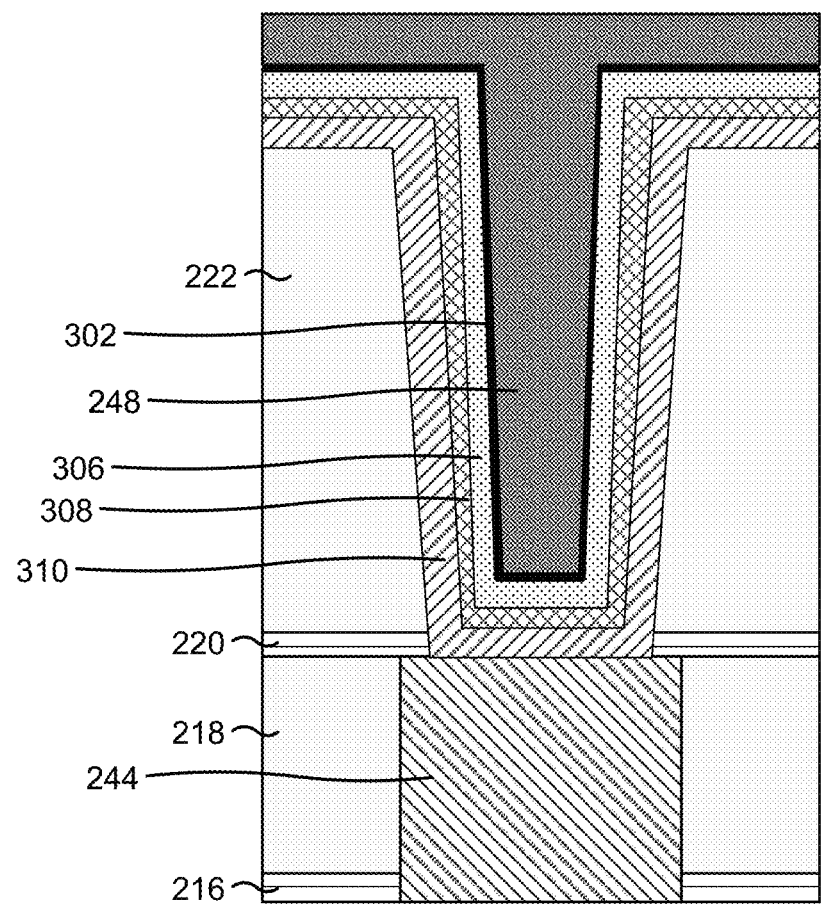

As shown in FIG. 4F, the conductive structure 248 may be formed in the recess 402 and over the graphene liner 302. The deposition tool 102 may deposit the copper of the conductive structure 248 using a CVD technique, a PVD technique, an ALD technique, or another type of deposition technique, the plating tool 112 may deposit the copper of the conductive structure 248 using an electroplating operation, or a combination thereof. In some implementations, and as shown in FIG. 4F, the copper flows over the dielectric layer 222 as well as into the recess 402. As described herein, the graphene liner 302 reduces surface scattering of the conductive structure 248 by improving flow of the copper into the recess 402.

Figure 4G:
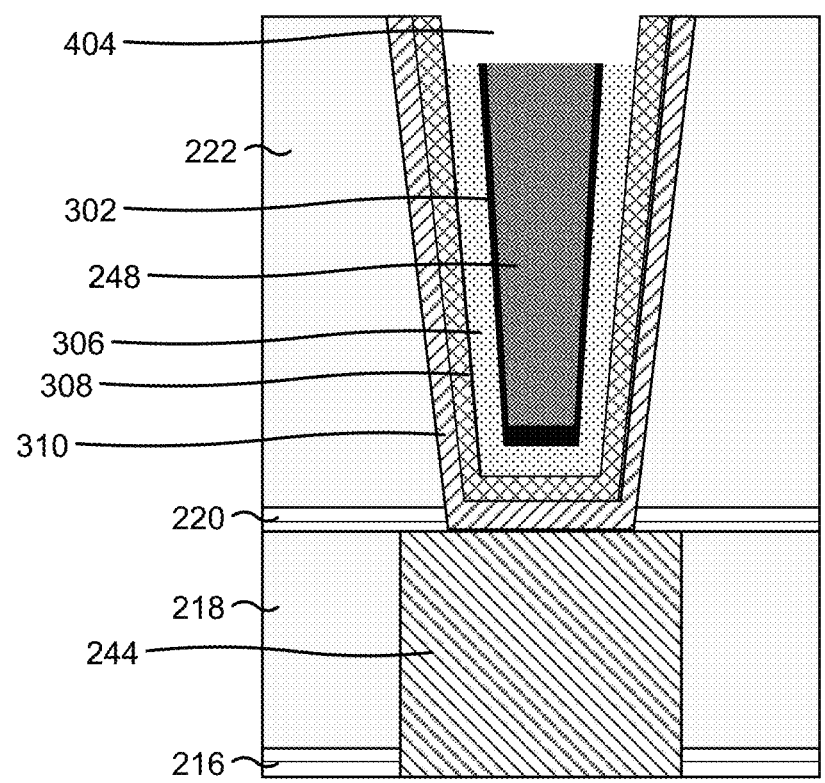

As shown in FIG. 4G, the conductive structure 248 may be planarized. The planarization tool 110 may planarize the conductive structure 248 after the conductive structure 248 is deposited. Additionally, portions of barrier layer 310, ruthenium liner 308, and/or cobalt liner 306 deposited over the dielectric layer 222 may be removed during planarization.

Figure 4H:
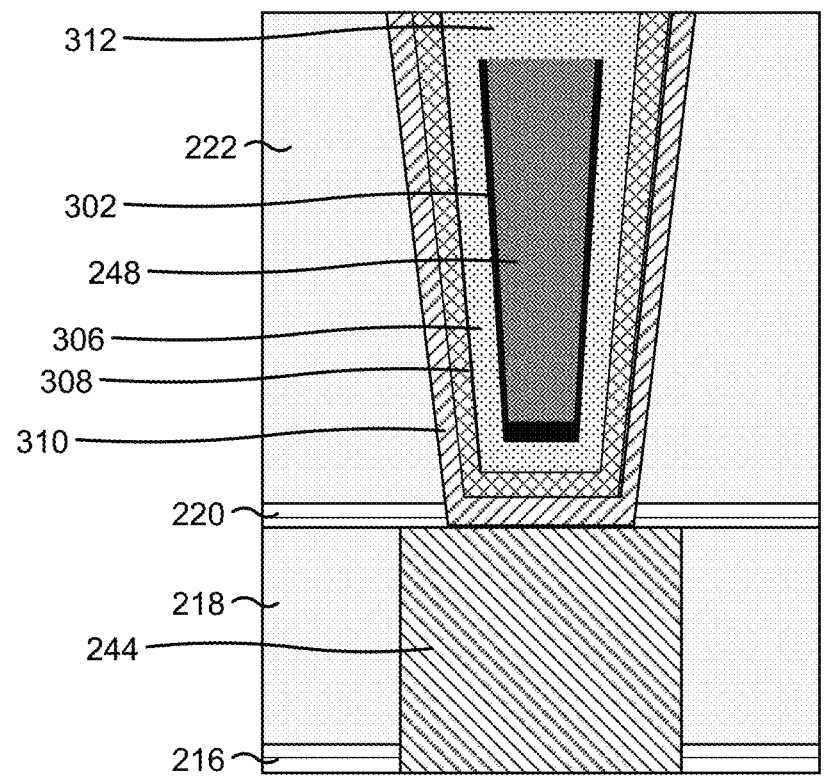

In some implementations, the planarization tool 110 uses CMP, which causes a recess 404 to form in the conductive structure 248 due to dishing. Accordingly, as shown in FIG. 4H, a cobalt cap 312 may be formed in the recess 404 and on a top surface of the conductive structure 248. Accordingly, a bottom surface of the cobalt cap 312 extends below a top surface of the dielectric layer 222. Additionally, or alternatively, and as shown in FIGS. 6G-6L, a top surface of the cobalt cap 312 extends above a top surface of the dielectric layer 222. For example, different combinations of the barrier layer 310, ruthenium liner 308, and cobalt liner 306 may result in different amounts of dishing to the conductive structure 248 such that the cobalt cap 312 may at least partially extend above the top surface of the dielectric layer 222 and/or at least partially extend below the top surface of the dielectric layer 222. In implementation 400, the cap 312 is cobalt. In other implementations, the cap 312 includes a ruthenium-cobalt alloy in order to reduce migration of cobalt atoms from the cap 312. In other implementations, the cap 312 includes ruthenium without cobalt to further reduce migration of cobalt atoms from the cap 312.

In some implementations, the cobalt cap 312 may be selectively deposited over the conductive structure 248 but not the dielectric layer 222 by using an organic precursor. Accordingly, a cleaning tool may remove the organic precursor from the conductive structure 248 and/or the dielectric layer 222 using a plasma.

Figure 4I:
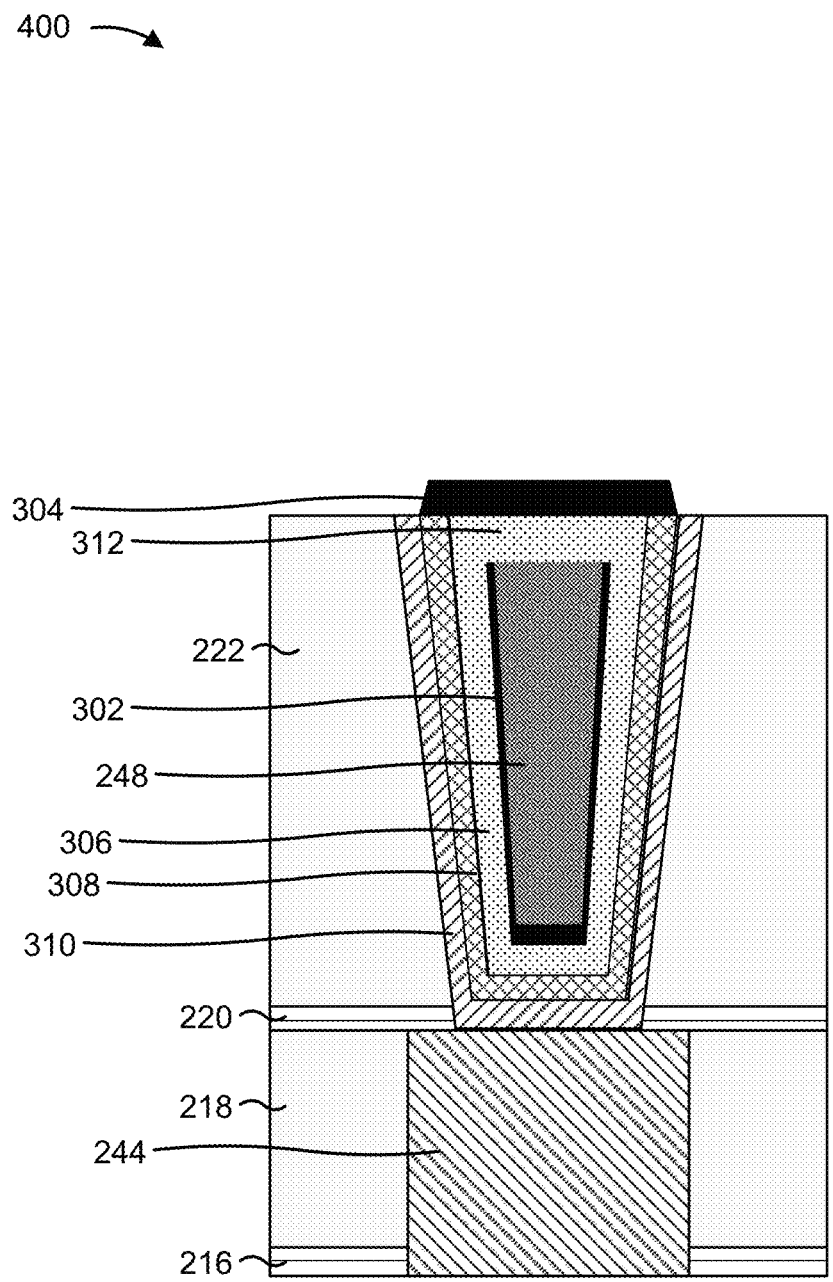

As shown in FIG. 4I, a graphene cap 304 may be formed over the cobalt cap 312. The deposition tool 102 may deposit the graphene cap 304 by a CVD technique, a PVD technique, an ALD technique, or another type of deposition technique. In some implementations, a ratio of a deposition time associated with the graphene cap 304 to a deposition time associated with the barrier layer 310, the ruthenium liner 308, or the cobalt liner 306 is in a range from approximately one to approximately two. Selecting a ratio of at least one ensures that the graphene cap 304 is thick enough to reduce surface scattering between the conductive structure 252 and the cobalt cap 312. Selecting a ratio of no more than two ensures that the graphene cap 304 is not so thick as to significantly increase contact resistance between conductive structure 248 and conductive structure 252. For example, the deposition tool 102 deposits the graphene cap 304 for an amount of time in a range from approximately 4 minutes to approximately 18 minutes.

In some implementations, the graphene cap 304 may be selectively deposited over the cobalt cap 312 but not the dielectric layer 222 by using a hydrocarbon-based precursor. Accordingly, the dielectric layer 222 may include hydrocarbon residue that is a byproduct of depositing the graphene cap 304.

Accordingly, a bi-layer cap is formed with a first layer including the graphene cap 304 and a second layer including the cobalt cap 312.

Figure 4J:
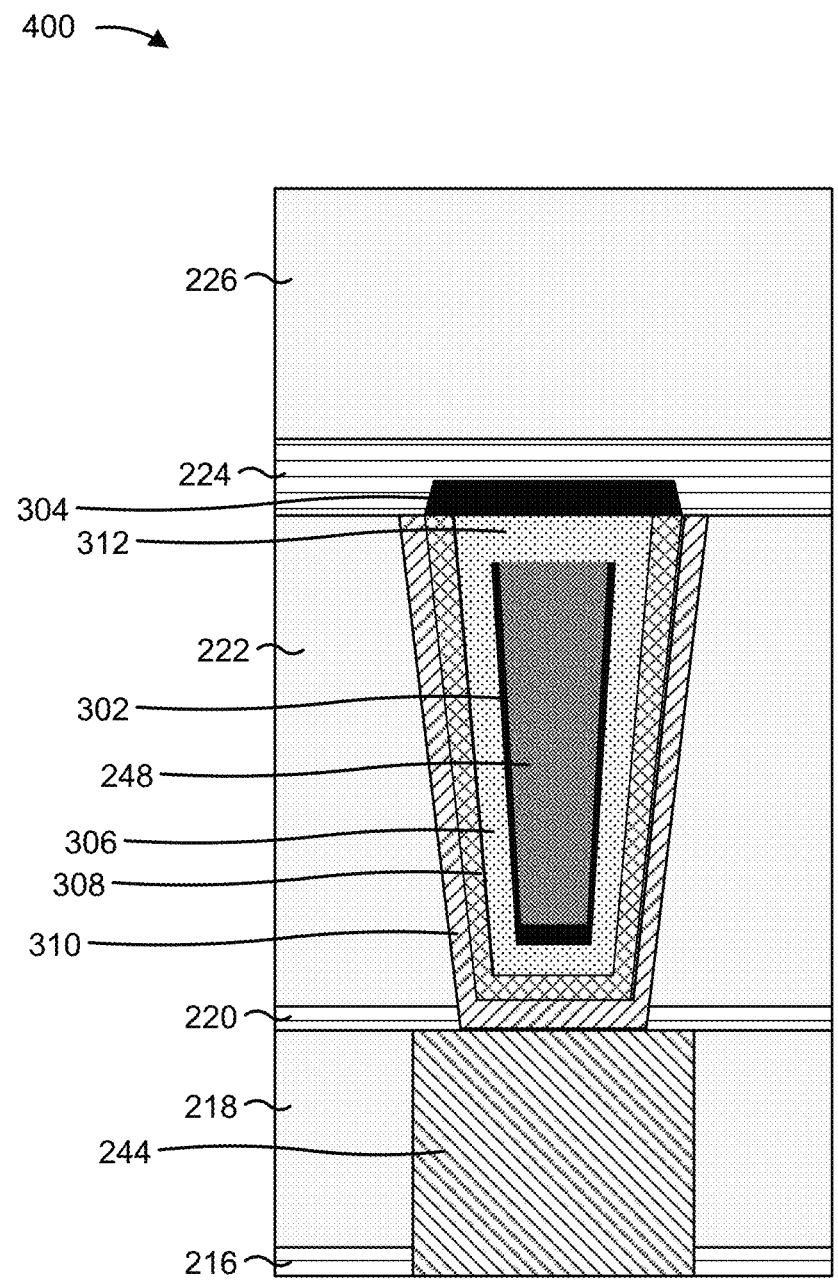

As shown in FIG. 4J, ESL 224 may be formed over the dielectric layer 222 and the conductive structure 248. The deposition tool 102 may deposit the ESL 224 by a CVD technique, a PVD technique, an ALD technique, or another type of deposition technique. The planarization tool 110 may planarize the ESL 224 after the ESL 224 is deposited.

Additionally, a dielectric layer 226 may be formed over the ESL 224. For example, the deposition tool 102 may deposit the dielectric layer 226 by a CVD technique, a PVD technique, an ALD technique, or another type of deposition technique. The planarization tool 110 may planarize the dielectric layer 226 after the dielectric layer 226 is deposited.

Figure 4K:
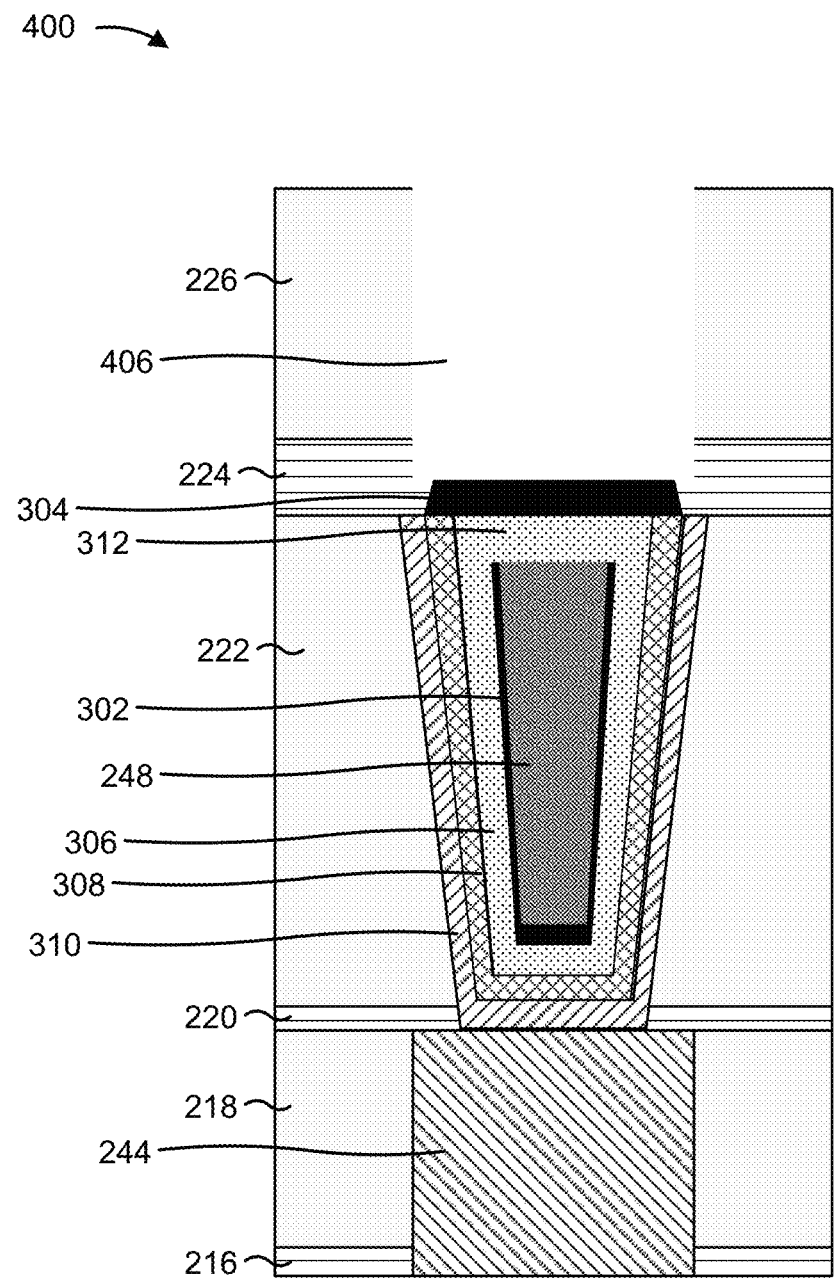

As shown in FIG. 4K, the dielectric layer 226 may be etched to form an opening (resulting in recess 406) such that the graphene cap 304 is at least partially exposed. For example, the deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 226 to form the recess 406. In some implementations, a photoresist removal tool removes the remaining portions of the photoresist layer (e.g., using a chemical stripper, a plasma asher, and/or another technique) after the etch tool 108 etches the recess 406.

Figure 4L:
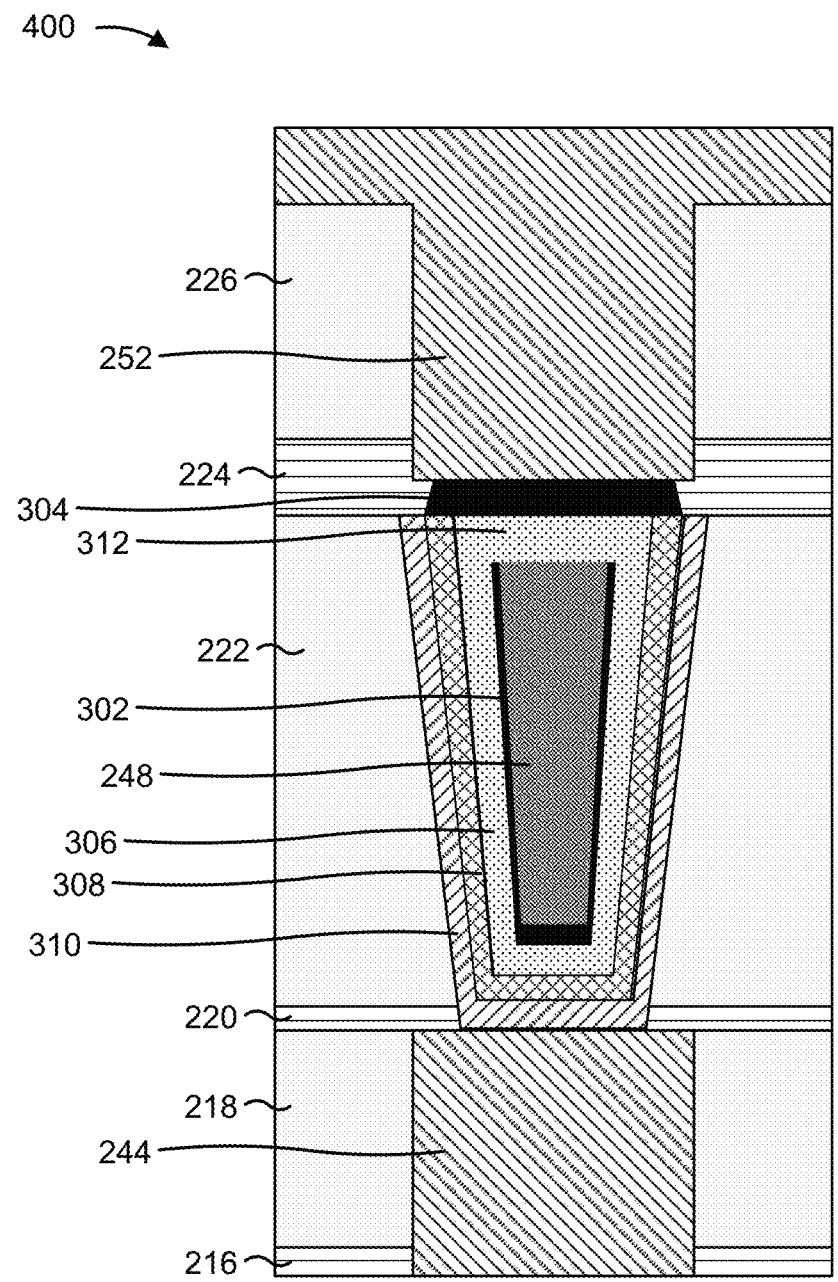

As shown in FIG. 4L, the conductive structure 252 may be formed in the recess 406 and over the graphene cap 304. The deposition tool 102 may deposit the copper of the conductive structure 252 using a CVD technique, a PVD technique, an ALD technique, or another type of deposition technique, the plating tool 112 may deposit the copper of the conductive structure 252 using an electroplating operation, or a combination thereof. In some implementations, and as shown in FIG. 4L, the copper flows over the dielectric layer 226 as well as into the recess 406. As described herein, the graphene cap 304 reduces surface scattering between the conductive structure 252 and the cobalt cap 312.

Figure 4M:
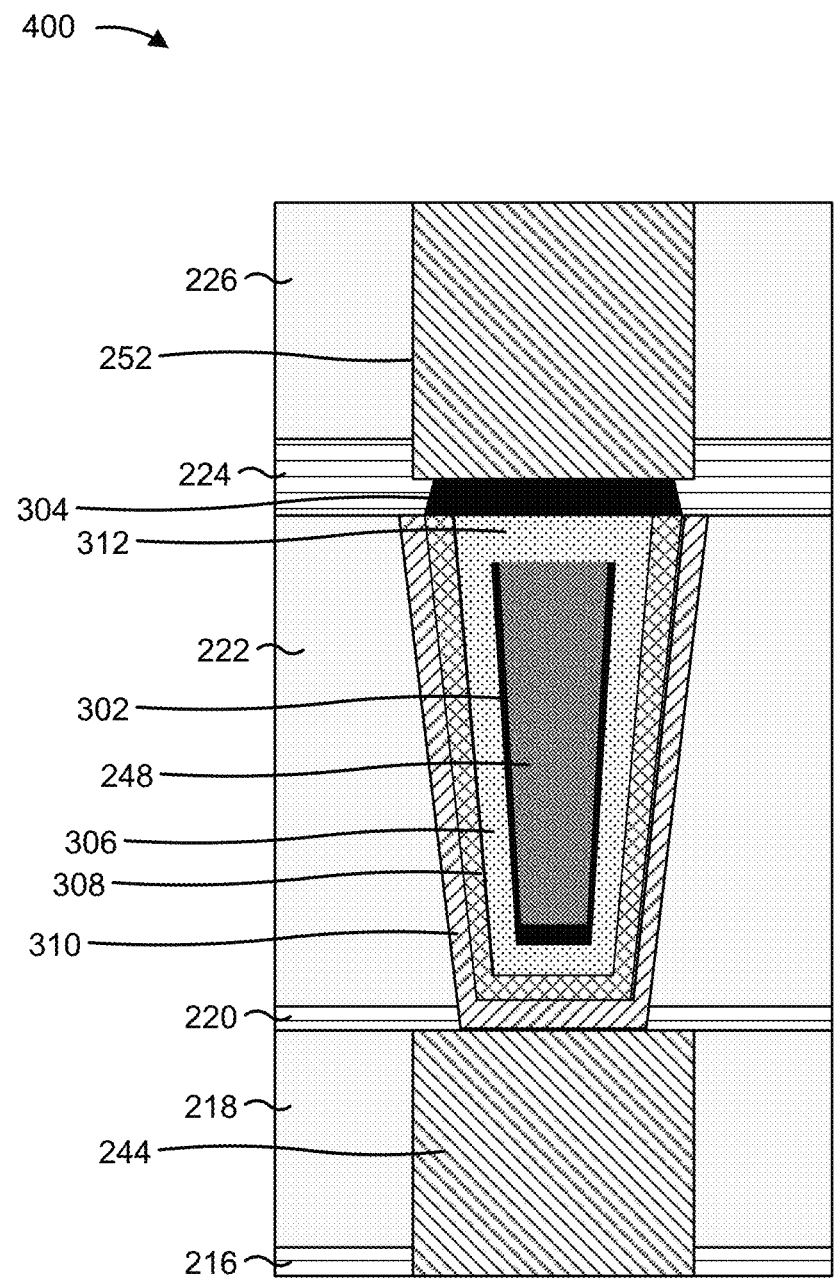

As shown in FIG. 4M, the conductive structure 252 may be planarized. The planarization tool 110 may planarize the conductive structure 252 after the conductive structure 252 is deposited.

Although described with respect to forming conductive structure 248, the description similarly applies forming an M0 metallization layer (e.g., conductive structure 244) and/or higher metallization layers (e.g., an M1 metallization layer, such as conductive structure 252). Similarly, although described with respect to forming the conductive structure 248 above a source or drain contact 230, the description similarly applies to forming a conductive structure above a gate contact 242 (e.g., conductive structure 240, conductive structure 246, via 250, and/or conductive structure 254, among other examples).

By using techniques as described in connection with FIGS. 4A-4M, the barrier layer 310, the ruthenium liner 308, and/or the cobalt liner 306 prevent diffusion of copper from the conductive structure 248, which reduces resistivity of the conductive structure 248, while the graphene liner 302 reduces surface scattering of the conductive structure 248. Similarly, the cobalt cap 312 prevents diffusion of copper from the conductive structure 248, which reduces resistivity of the conductive structure 248, while the graphene cap 304 reduces surface scattering between the cobalt cap 312 and the conductive structure 252.

As indicated above, FIGS. 4A-4M are provided as one or more examples. Other examples may differ from what is described with regard to FIGS. 4A-4M. For example, in some implementations, one or more of the barrier layer 310, the ruthenium liner 308, or the cobalt liner 306 may be omitted. Additionally, or alternatively, the graphene liner 302 may be implemented without the graphene cap 304, or the graphene cap 304 may be implemented without the graphene liner 302.

FIGS. 5A-5I are diagrams of an example implementation 500 described herein. Example implementation 500 is similar to example implementation 400 but depicts a dual damascene process rather than a single damascene process.

Accordingly, example implementation 500 may be an example process for forming a conductive structure 248 with a graphene liner 302 and a graphene cap 304. The graphene liner 302 and the graphene cap 304 reduce contact resistance, which increases electrical performance of an electronic device including the conductive structure 248. Additionally, the graphene liner 302 results in more symmetric deposition of the conductive structure 248, which reduces surface scattering of the conductive structure 248, and the graphene cap 304 results in more symmetric deposition of the conductive structure 252, which reduces surface scattering of conductive structure 252.

Although described with both the graphene liner 302 and the graphene cap 304, the graphene liner 302 may be used without the graphene cap 304, or the graphene cap 304 may be used without the graphene liner 302. Using only a graphene liner 302 or only a graphene cap 304 reduces time and materials consumed during formation of the conductive structure 248.

Figure 5A:
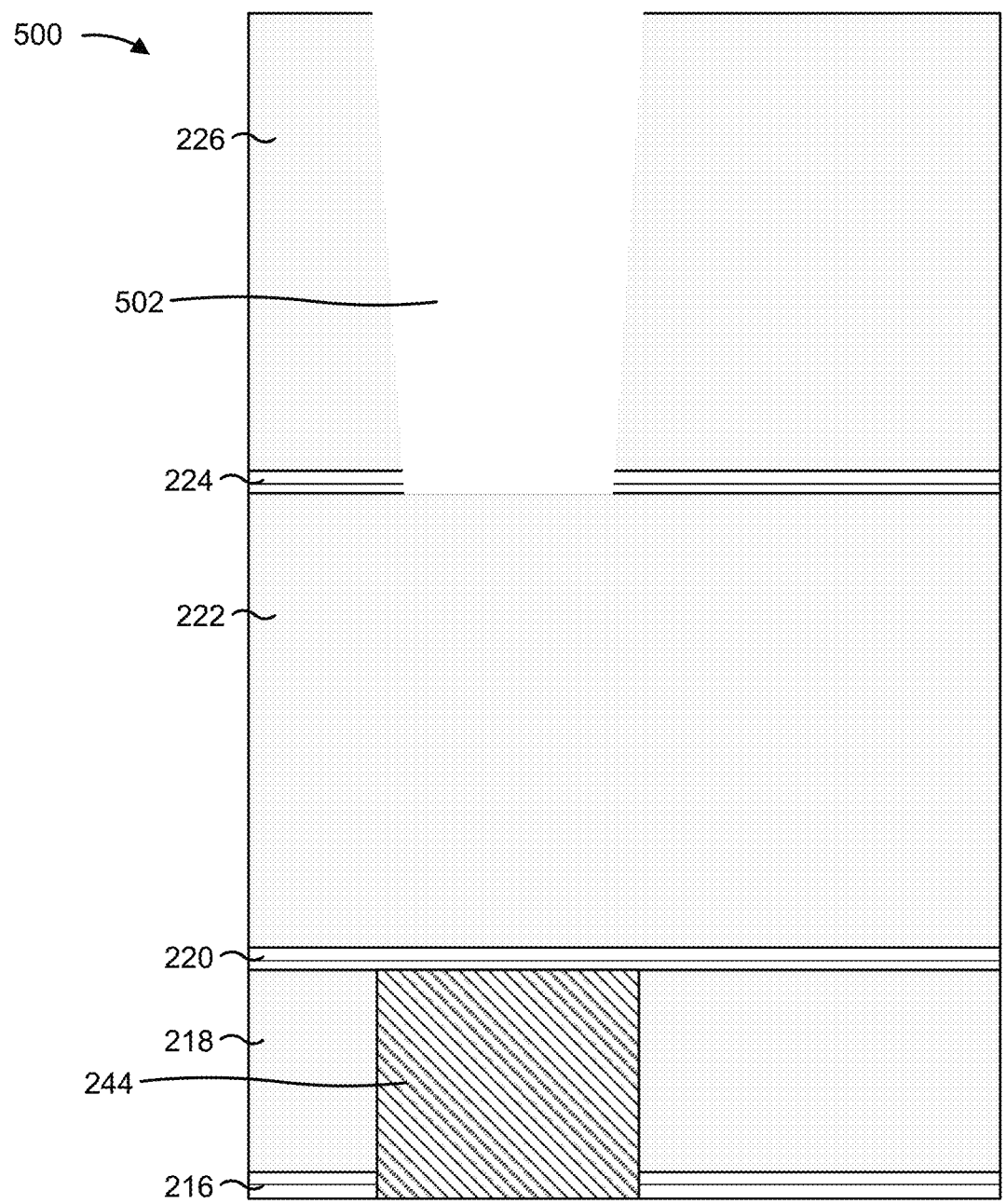
FIGS. 5A-5I are diagrams of an example implementation described herein.

As shown in FIG. 5A, the example process for forming the conductive structure 248 may be performed in connection with an MEOL. In some implementations, the MEOL includes a conductive structure 244 formed in a dielectric layer 218 that is above an ESL 216.

An ESL 220 may be formed over the dielectric layer 218 and the conductive structure 244. The deposition tool 102 may deposit the ESL 220 by a CVD technique, a PVD technique, an ALD technique, or another type of deposition technique. The planarization tool 110 may planarize the ESL 220 after the ESL 220 is deposited. A dielectric layer 222 may be formed over the ESL 220. For example, the deposition tool 102 may deposit the dielectric layer 222 by a CVD technique, a PVD technique, an ALD technique, or another type of deposition technique. The planarization tool 110 may planarize the dielectric layer 222 after the dielectric layer 222 is deposited.

Similarly, an ESL 224 may be formed over the dielectric layer 222, and a dielectric layer 226 may be formed over the ESL 224.

As further shown in FIG. 5A, the dielectric layer 226 may be etched to form an opening (resulting in recess 502). For example, the deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 226 to form the recess 502. In some implementations, a photoresist removal tool removes the remaining portions of the photoresist layer (e.g., using a chemical stripper, a plasma asher, and/or another technique) after the etch tool 108 etches the recess 502.

Figure 5B:
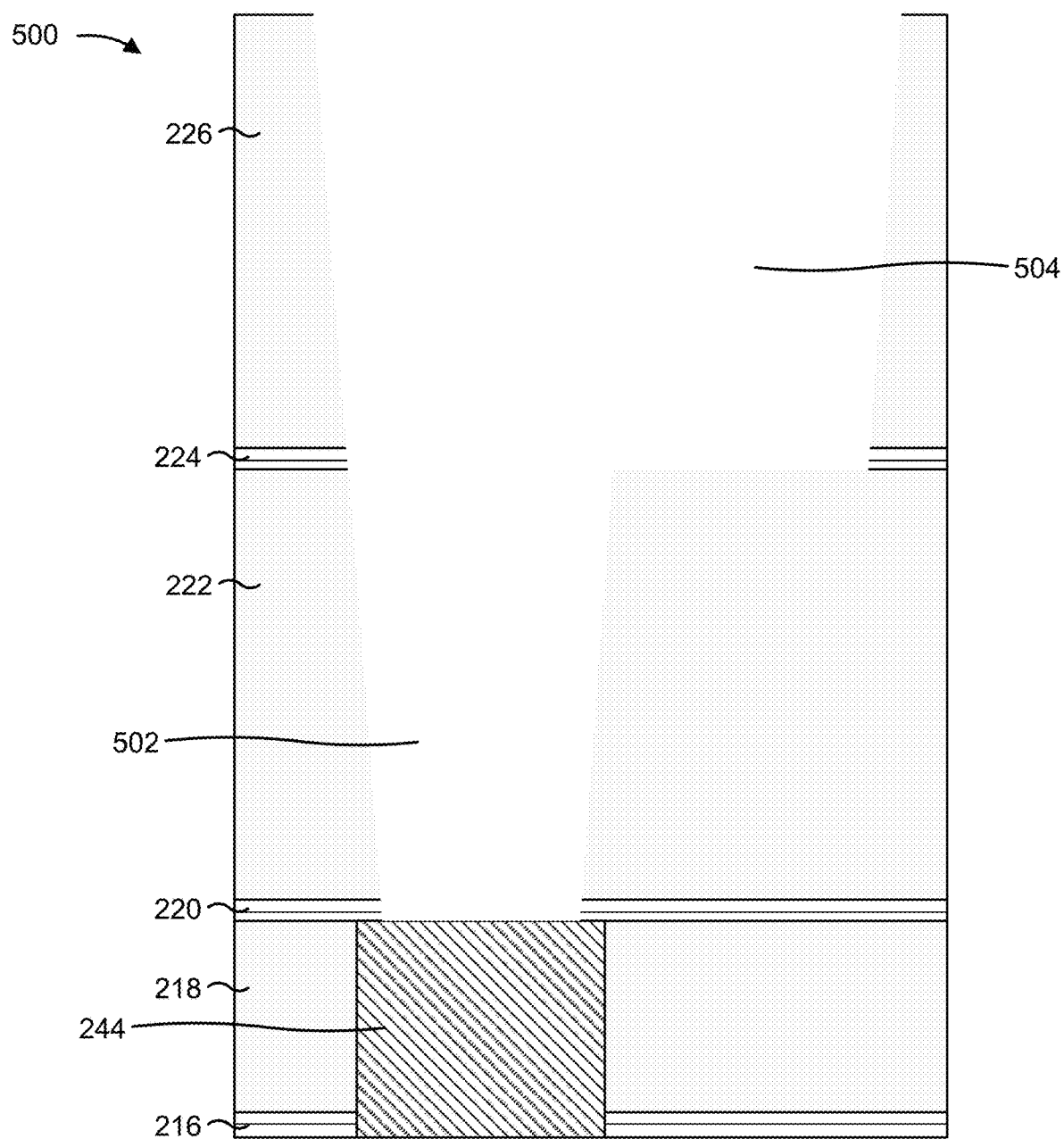

As further shown in FIG. 5B, the dielectric layers 222 and 226 may be further etched to expand recess 502 into the dielectric layer 222 to at least partially expose the conductive structure 244 as well as form a wider opening in the dielectric layer 226 (resulting in recess 504). For example, the deposition tool 102 may form a photoresist layer on the dielectric layers 222 and 226 (or on ESLs formed on the dielectric layers 222 and 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layers 222 and 226 to expand recess 502 and expose the recess 504. In some implementations, a photoresist removal tool removes the remaining portions of the photoresist layer (e.g., using a chemical stripper, a plasma asher, and/or another technique) after the etch tool 108 expands the recess 502 and etches the recess 504.

Figure 5C:
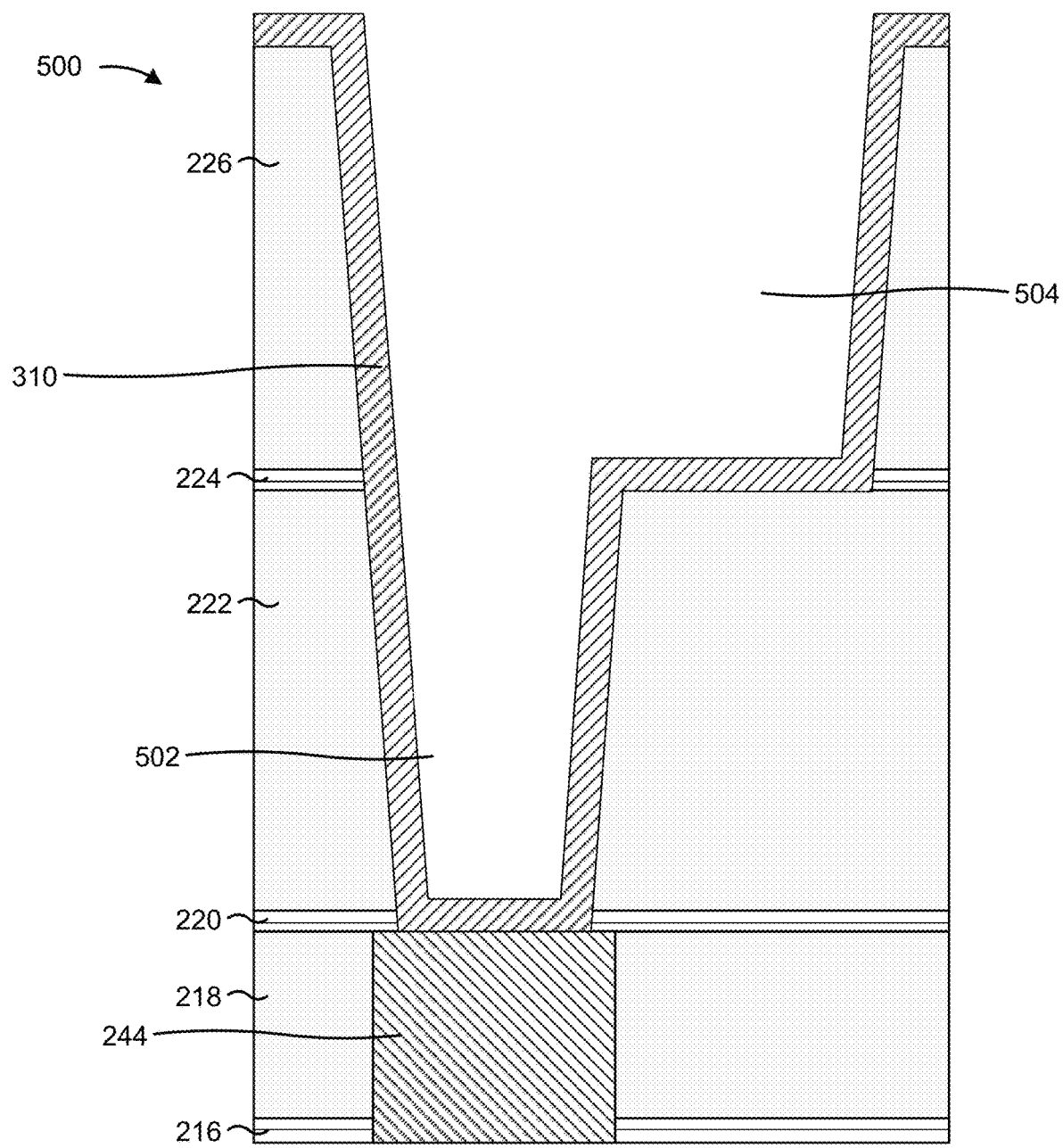

As shown in FIG. 5C, a barrier layer 310 may be formed over the exposed surface of the conductive structure 244 and sidewalls of the recesses 502 and 504. The deposition tool 102 may deposit the barrier layer 310 by a CVD technique, a PVD technique, an ALD technique, or another type of deposition technique. In some implementations, and as shown in FIG. 5C, the barrier layer 310 is deposited on the dielectric layer 226 as well. In some implementations, as described in connection with FIG. 4B, the deposition tool 102 deposits the barrier layer 310 for an amount of time in a range from approximately 1 minute to approximately 10 minutes.

Figure 5D:
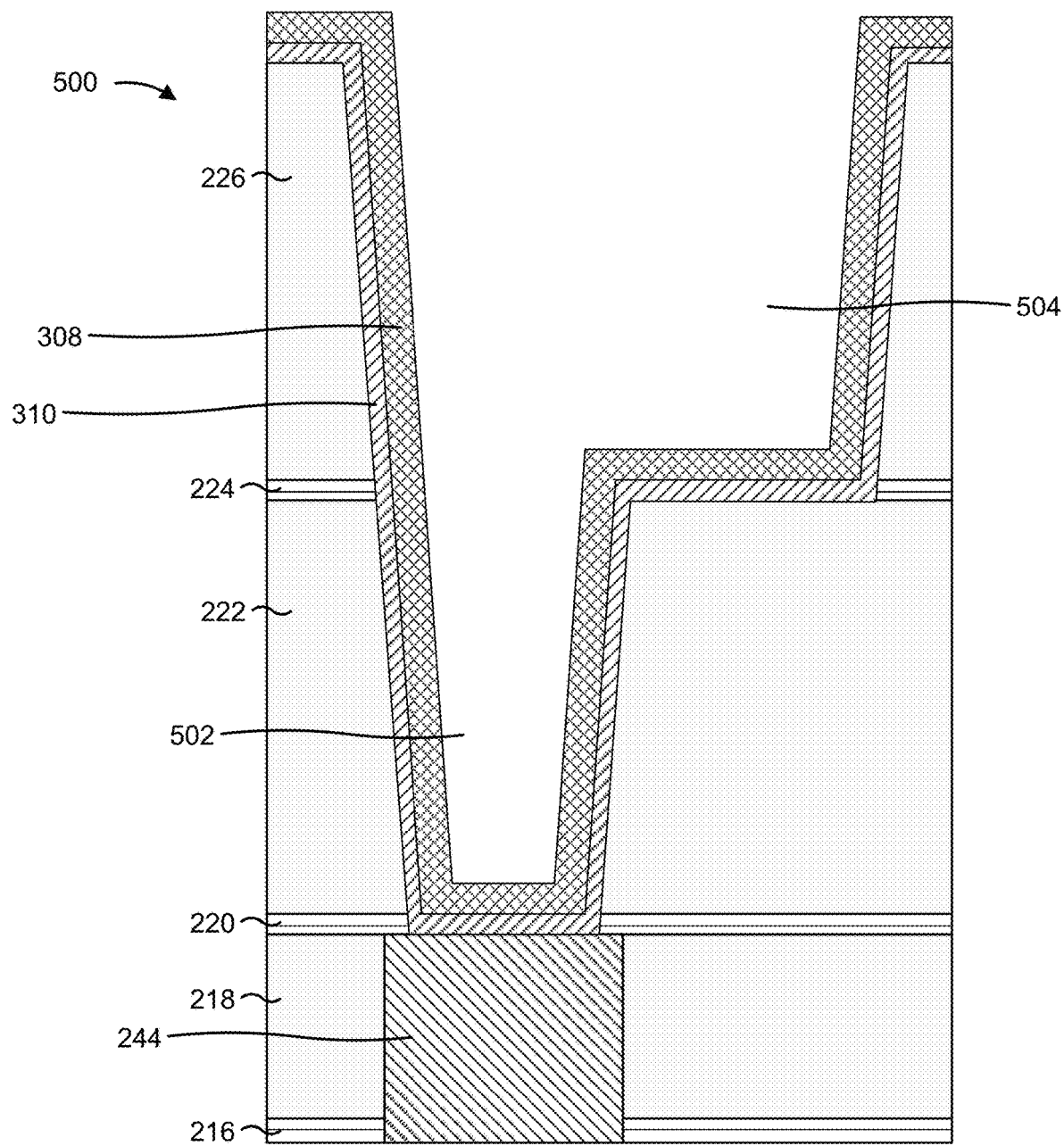

As shown in FIG. 5D, a ruthenium liner 308 may be formed over the barrier layer 310. The deposition tool 102 may deposit the ruthenium liner 308 by a CVD technique, a PVD technique, an ALD technique, or another type of deposition technique. In some implementations, and as shown in FIG. 5D, the ruthenium liner 308 is deposited over the dielectric layer 226 as well. In some implementations, as described in connection with FIG. 4C, the deposition tool 102 deposits the ruthenium liner 308 for an amount of time in a range from approximately 1 minute to approximately 10 minutes. In implementation 500, the ruthenium liner 308 is used in combination with the barrier layer 310. In other implementations, the ruthenium liner 308 is used without the barrier layer 310 in order to further reduce contact resistance between conductive structure 244 and conductive structure 248. In other implementations, the barrier layer 310 is used without the ruthenium liner 308 in order to further reduce sheet resistance of conductive structure 248. In such implementations, the barrier layer 310 may be doped with ruthenium in order to reduce surface scattering of conductive structure 248. For example, the ion implantation tool 114 may dope the barrier layer 310 with ruthenium ions.

Figure 5E:
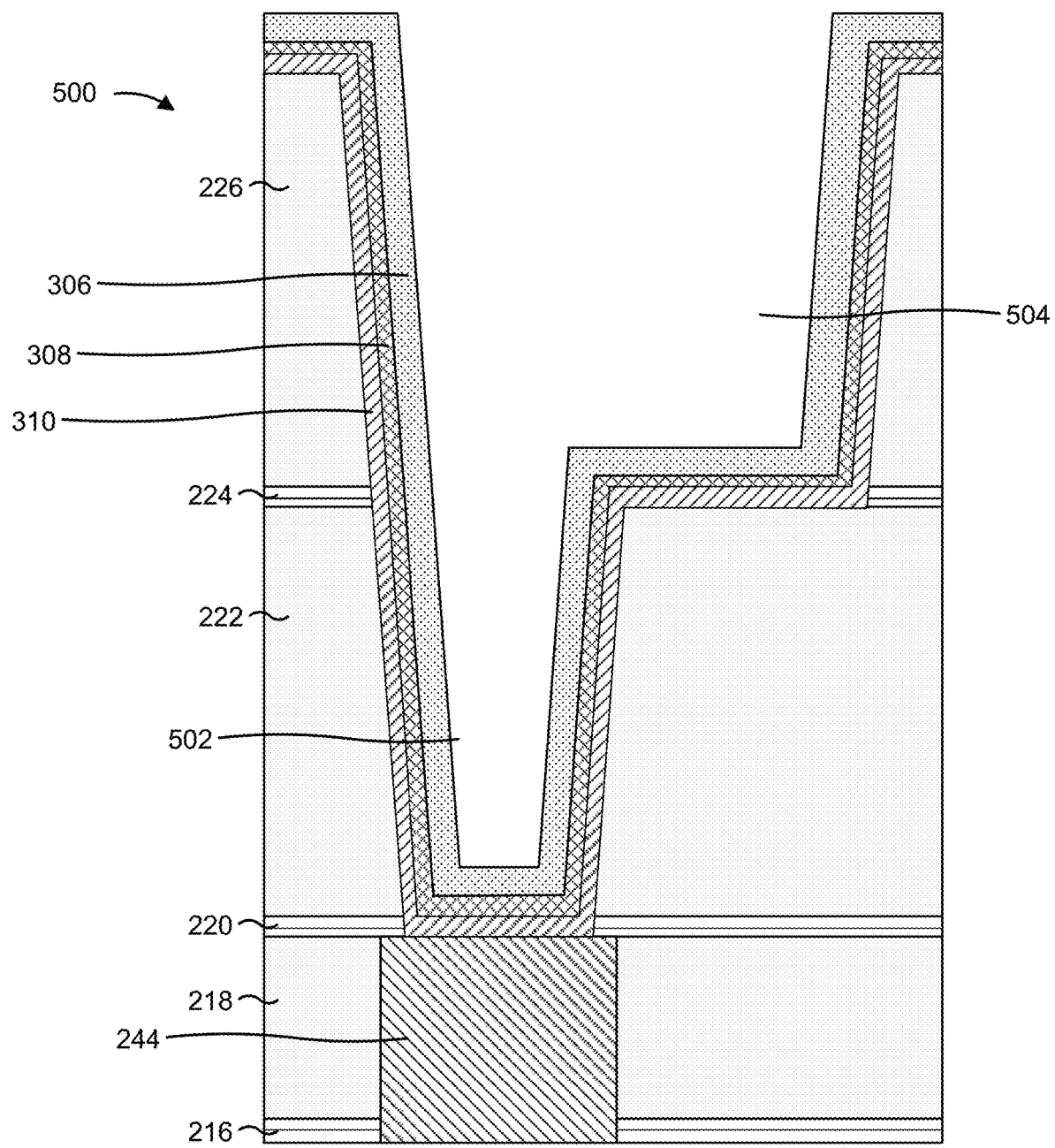

As shown in FIG. 5E, a cobalt liner 306 may be formed over the ruthenium liner 308. The deposition tool 102 may deposit the barrier layer 310 by a CVD technique, a PVD technique, an ALD technique, or another type of deposition technique. In some implementations, and as shown in FIG. 5E, the cobalt liner 306 is deposited over the dielectric layer 226 as well. In some implementations, as described in connection with FIG. 4D, the deposition tool 102 deposits the cobalt liner 306 for an amount of time in a range from approximately 1 minute to approximately 10 minutes. In implementation 500, the cobalt liner 306 is used in combination with the ruthenium liner 308. In other implementations, the cobalt liner 306 is used without the ruthenium liner 308 (and thus is deposited on the barrier layer 310) in order to further reduce sheet resistance of conductive structure 248. In other implementations, the cobalt liner 306 is omitted in order to prevent diffusion of cobalt atoms.

Figure 5F:
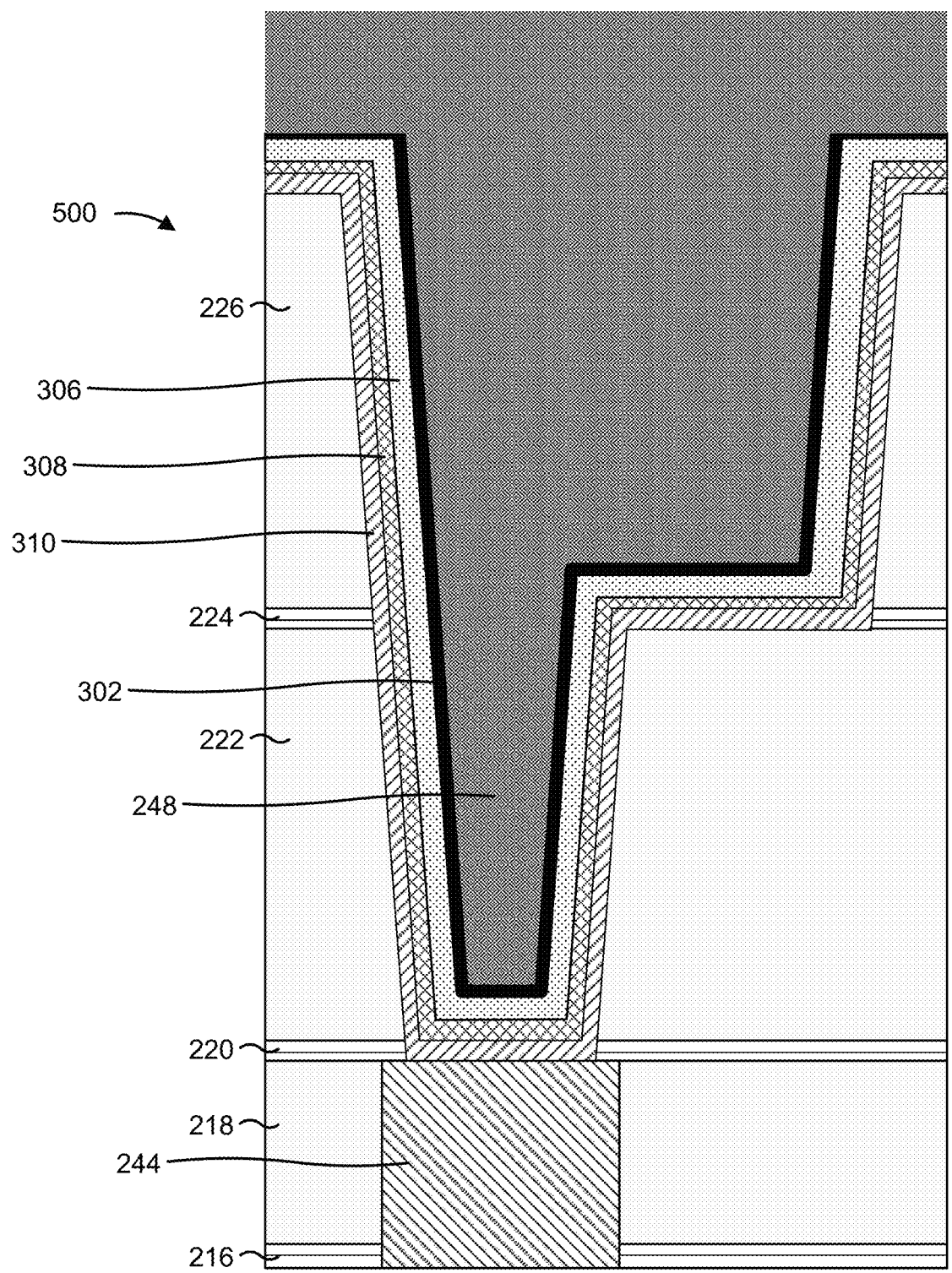

As shown in FIG. 5F, a graphene liner 302 may be formed over the cobalt liner 306. The deposition tool 102 may deposit the graphene liner 302 by a CVD technique, a PVD technique, an ALD technique, or another type of deposition technique. In some implementations, and as shown in FIG. 5F, the graphene liner 302 is deposited over the dielectric layer 226 as well. In some implementations, as described in connection with FIG. 4E, a ratio of a deposition time associated with the graphene liner 302 to a deposition time associated with the barrier layer 310, the ruthenium liner 308, or the cobalt liner 306 is in a range from approximately one to approximately two. For example, the deposition tool 102 deposits the graphene liner 302 for an amount of time in a range from approximately 4 minutes to approximately 18 minutes.

Accordingly, a bi-layer liner is formed with a first layer including the graphene layer 302 and a second layer including the cobalt liner 306, the ruthenium liner 308, and the barrier layer 310.

As further shown in FIG. 5F, the conductive structure 248 may be formed in the recesses 502 and 504 and over the graphene liner 302. The deposition tool 102 may deposit the copper of the conductive structure 244 using a CVD technique, a PVD technique, an ALD technique, or another type of deposition technique, the plating tool 112 may deposit the copper of the conductive structure 248 using an electroplating operation, or a combination thereof. In some implementations, and as shown in FIG. 5F, the copper flows over the dielectric layer 226 as well as into the recesses 502 and 504. As described herein, the graphene liner 302 reduces surface scattering of the conductive structure 248 by improving flow of the copper into the recesses 502 and 504.

Figure 5G:
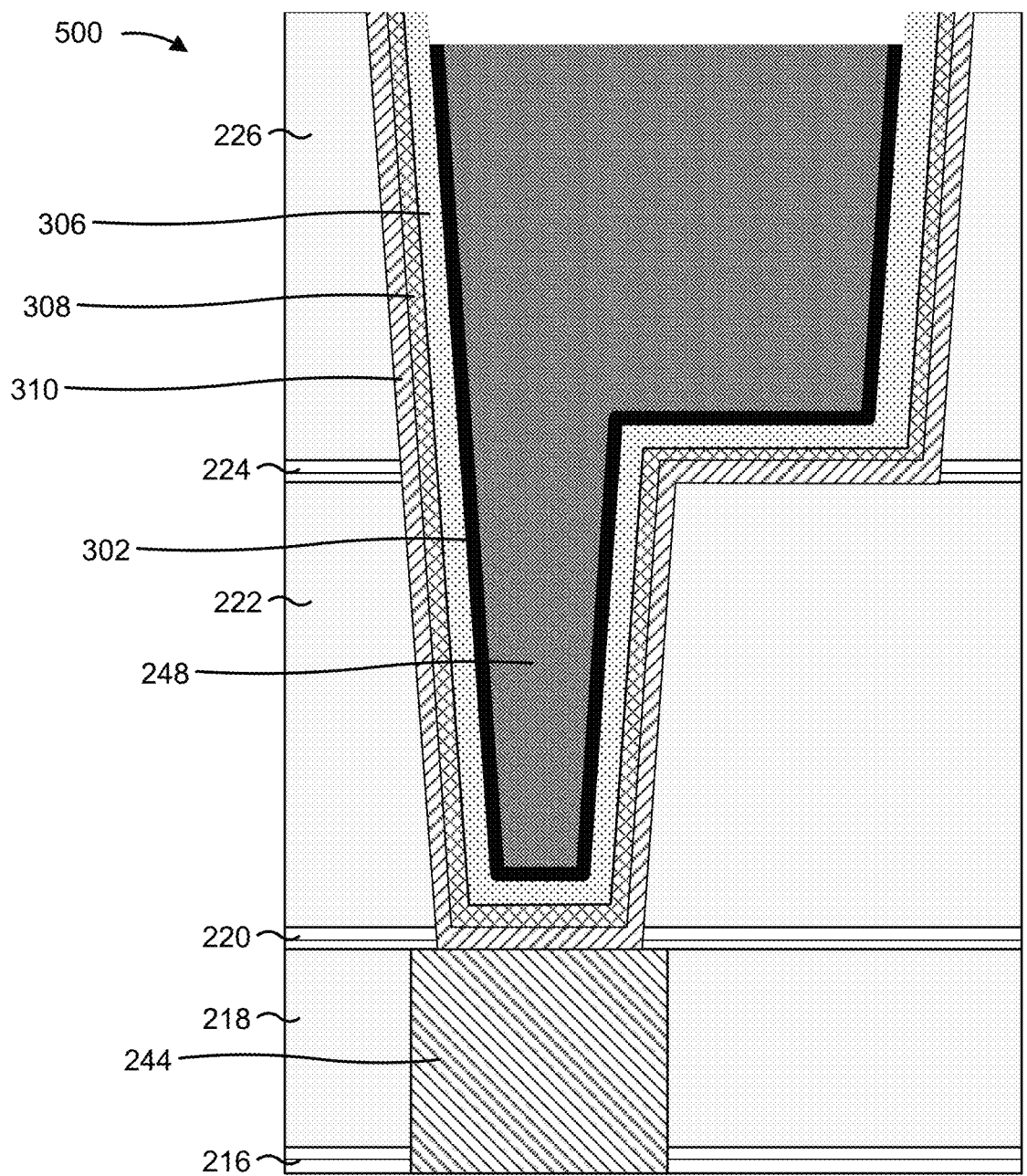

As shown in FIG. 5G, the conductive structure 248 may be planarized. The planarization tool 110 may planarize the conductive structure 248 after the conductive structure 248 is deposited. Additionally, portions of barrier layer 310, ruthenium liner 308, and/or cobalt liner 306 deposited over the dielectric layer 226 may be removed during planarization.

Figure 5H:
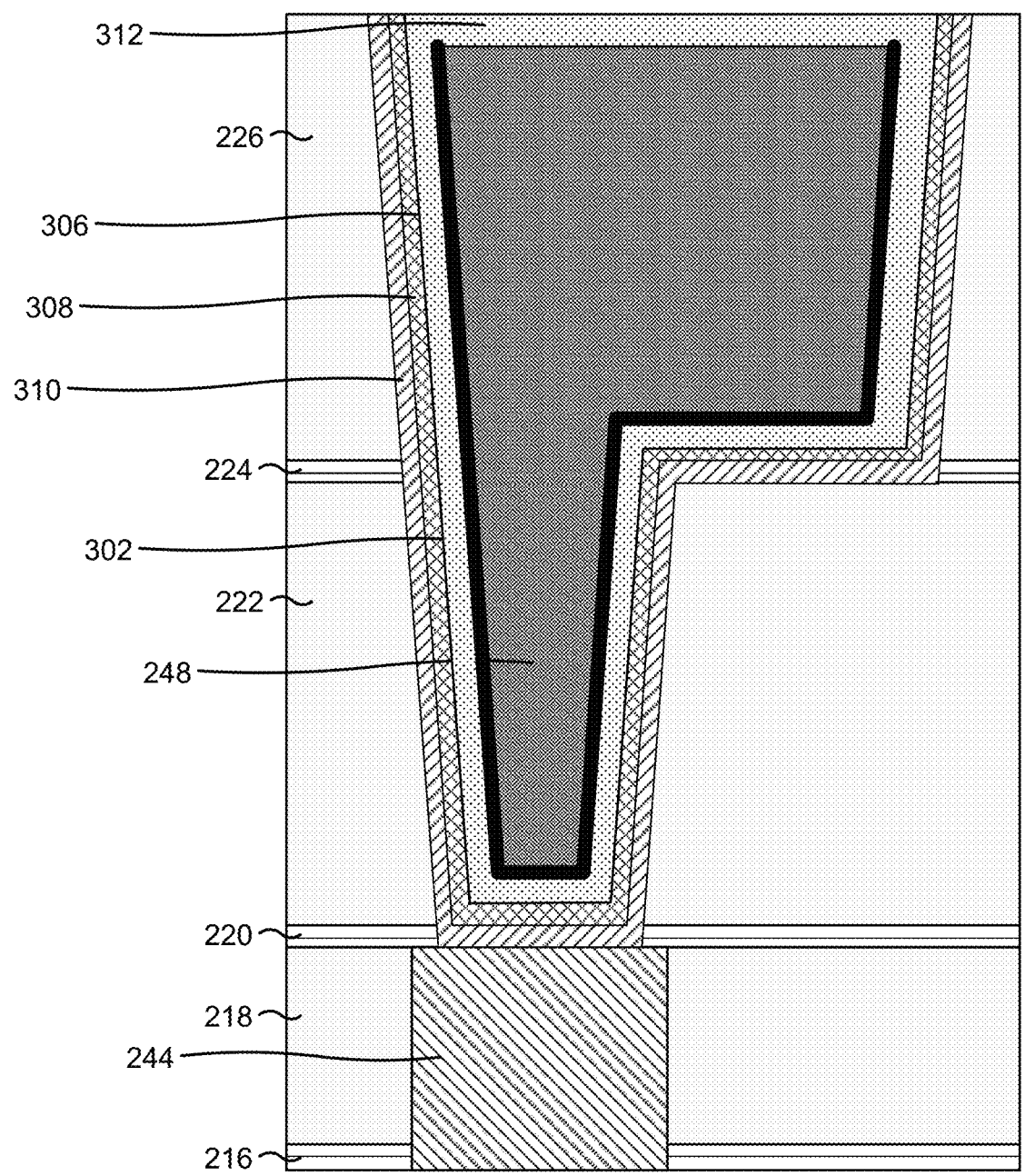

In some implementations, the planarization tool 110 uses CMP, which causes a recess to form in the conductive structure 248 due to dishing. Accordingly, as shown in FIG. 5H, a cobalt cap 312 may be formed in the recess and on a top surface of the conductive structure 248. Accordingly, a bottom surface of the cobalt cap 312 extends below a top surface of the dielectric layer 226. Additionally, or alternatively, and as shown in FIGS. 6G-6L, a top surface of the cobalt cap 312 extends above a top surface of the dielectric layer 226. For example, different combinations of the barrier layer 310, ruthenium liner 308, and cobalt liner 306 may result in different amounts of dishing to the conductive structure 248 such that the cobalt cap 312 may at least partially extend above the top surface of the dielectric layer 226 and/or at least partially extend below the top surface of the dielectric layer 226. In implementation 500, the cap 312 is cobalt. In other implementations, the cap 312 includes a ruthenium-cobalt alloy in order to reduce migration of cobalt atoms from the cap 312. In other implementations, the cap 312 includes ruthenium without cobalt to further reduce migration of cobalt atoms from the cap 312.

In some implementations, the cobalt cap 312 may be selectively deposited over the conductive structure 248 but not the dielectric layer 226 by using an organic precursor. Accordingly, a cleaning tool may remove the organic precursor from the conductive structure 248 and/or the dielectric layer 226 using a plasma.

Figure 5I:
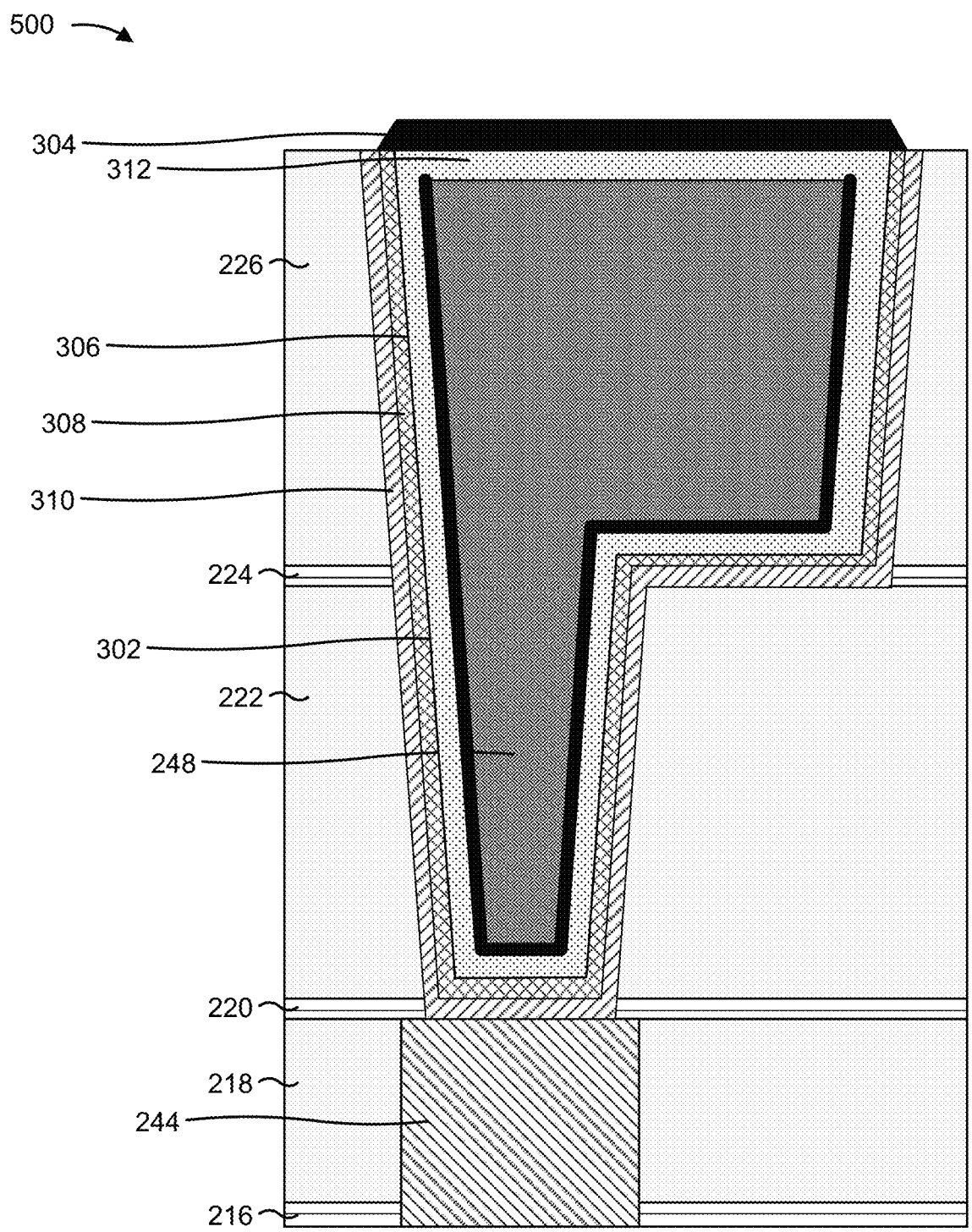

As shown in FIG. 5I, a graphene cap 304 may be formed over the cobalt cap 312. The deposition tool 102 may deposit the graphene cap 304 by a CVD technique, a PVD technique, an ALD technique, or another type of deposition technique. In some implementations, as described in connection with FIG. 4I, a ratio of a deposition time associated with the graphene cap 304 to a deposition time associated with the barrier layer 310, the ruthenium liner 308, or the cobalt liner 306 is in a range from approximately one to approximately two. For example, the deposition tool 102 deposits the graphene cap 304 for an amount of time in a range from approximately 4 minutes to approximately 18 minutes.

In some implementations, the graphene cap 304 may be selectively deposited over the cobalt cap 312 but not the dielectric layer 226 by using a hydrocarbon-based precursor. Accordingly, the dielectric layer 226 may include hydrocarbon residue that is a byproduct of depositing the graphene cap 304. In some implementations, additional BEOL conductive structures may be formed on the graphene cap 304 (e.g., similarly as described above in connection with FIGS. 4J-4M).

Accordingly, a bi-layer cap is formed with a first layer including the graphene cap 304 and a second layer including the cobalt cap 312.

Although described with respect to forming conductive structure 248, the description similarly applies forming an M0 metallization layer (e.g., conductive structure 244) and/or higher metallization layers (e.g., an M1 metallization layer, such as conductive structure 252). Similarly, although described with respect to forming the conductive structure 248 above a source or drain contact 230, the description similarly applies to forming a conductive structure above a gate contact 242 (e.g., conductive structure 240, conductive structure 246, via 250, and/or conductive structure 254, among other examples).

By using techniques as described in connection with FIGS. 5A-5I, the barrier layer 310, the ruthenium liner 308, and/or the cobalt liner 306 prevent diffusion of copper from the conductive structure 248, which reduces resistivity of the conductive structure 248, while the graphene liner 302 reduces surface scattering of the conductive structure 248. Similarly, the cobalt cap 312 prevents diffusion of copper from the conductive structure 248, which reduces resistivity of the conductive structure 248, while the graphene cap 304 reduces surface scattering between the cobalt cap 312 and a BEOL conductive structure formed thereon.

As indicated above, FIGS. 5A-5I are provided as one or more examples. Other examples may differ from what is described with regard to FIGS. 5A-5I. For example, in some implementations, one or more of the barrier layer 310, the ruthenium liner 308, or the cobalt liner 306 may be omitted. Additionally, or alternatively, the graphene liner 302 may be implemented without the graphene cap 304, or the graphene cap 304 may be implemented without the graphene liner 302.

FIGS. 6A-6L are diagrams of an example implementation 600 described herein. Example implementation 600 is similar to example implementation 400 but omits cobalt liner 306 and depicts cobalt cap 312 extending above a top surface of dielectric layer 222.

Accordingly, example implementation 600 may be an example process for forming a conductive structure 248 with a graphene liner 302 and a graphene cap 304. The graphene liner 302 and the graphene cap 304 reduce contact resistance, which increases electrical performance of an electronic device including the conductive structure 248. Additionally, the graphene liner 302 results in more symmetric deposition of the conductive structure 248, which reduces surface scattering of the conductive structure 248, and the graphene cap 304 results in more symmetric deposition of the conductive structure 252, which reduces surface scattering of conductive structure 252.

Although described with both the graphene liner 302 and the graphene cap 304, the graphene liner 302 may be used without the graphene cap 304, or the graphene cap 304 may be used without the graphene liner 302. Using only a graphene liner 302 or only a graphene cap 304 reduces time and materials consumed during formation of the conductive structure 248.

Figure 6A:
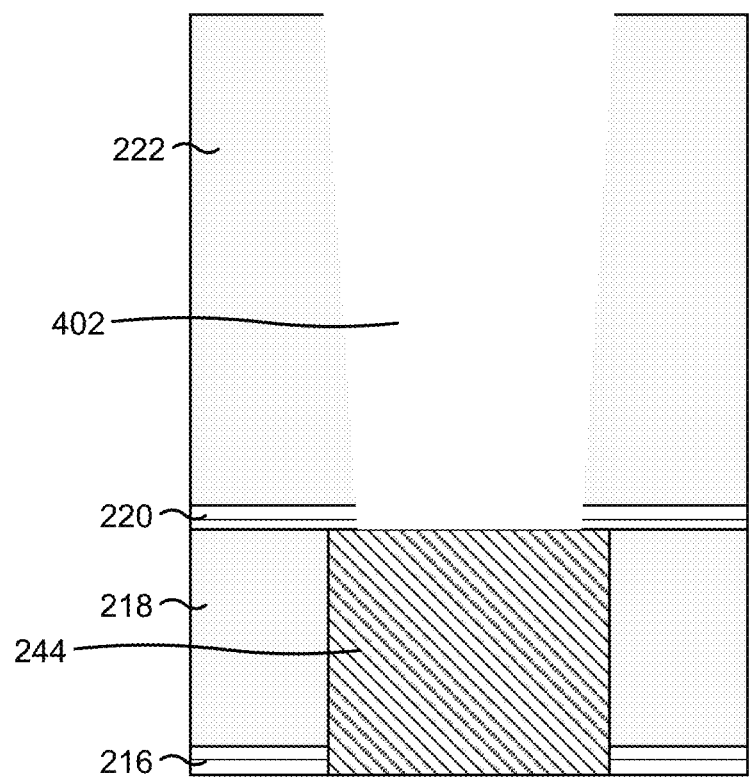
FIGS. 6A-6L are diagrams of an example implementation described herein.

As shown in FIG. 6A, the example process for forming the conductive structure 248 may be performed in connection with an MEOL. In some implementations, the MEOL includes a conductive structure 244 formed in a dielectric layer 218 that is above an ESL 216.

An ESL 220 may be formed over the dielectric layer 218 and the conductive structure 244. The deposition tool 102 may deposit the ESL 220 by a CVD technique, a PVD technique, an ALD technique, or another type of deposition technique. The planarization tool 110 may planarize the ESL 220 after the ESL 220 is deposited.

A dielectric layer 222 may be formed over the ESL 220. For example, the deposition tool 102 may deposit the dielectric layer 222 by a CVD technique, a PVD technique, an ALD technique, or another type of deposition technique. The planarization tool 110 may planarize the dielectric layer 222 after the dielectric layer 222 is deposited.

As further shown in FIG. 6A, the dielectric layer 218 may be etched to form an opening (resulting in recess 402) such that the conductive structure 244 is at least partially exposed.

For example, the deposition tool 102 may form a photoresist layer on the dielectric layer 222 (or on an ESL formed on the dielectric layer 222, such as ESL 224), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 222 to form the recess 402. In some implementations, a photoresist removal tool removes the remaining portions of the photoresist layer (e.g., using a chemical stripper, a plasma asher, and/or another technique) after the etch tool 108 etches the recess 402.

Figure 6B:
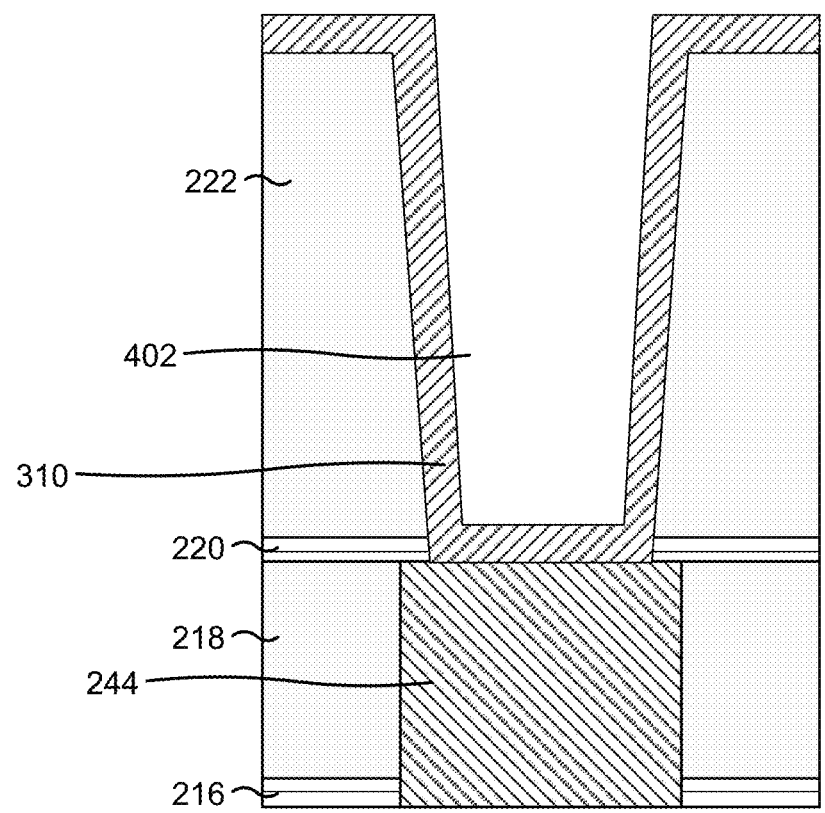

As shown in FIG. 6B, a barrier layer 310 may be formed over the exposed surface of the conductive structure 244 and sidewalls of the recess 402. The deposition tool 102 may deposit the barrier layer 310 by a CVD technique, a PVD technique, an ALD technique, or another type of deposition technique. In some implementations, and as shown in FIG. 6B, the barrier layer 310 is deposited on the dielectric layer 222 as well. In some implementations, as described in connection with FIG. 4B, the deposition tool 102 deposits the barrier layer 310 for an amount of time in a range from approximately 1 minute to approximately 10 minutes.

Figure 6C:
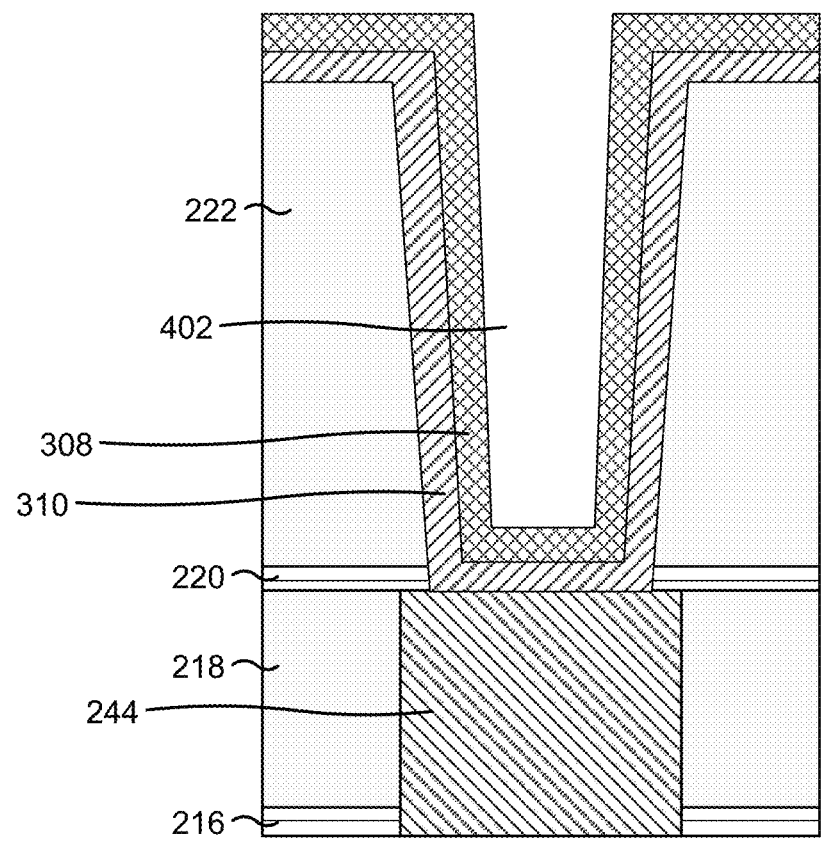

As shown in FIG. 6C, a ruthenium liner 308 may be formed over the barrier layer 310. The deposition tool 102 may deposit the ruthenium liner 308 by a CVD technique, a PVD technique, an ALD technique, or another type of deposition technique. In some implementations, and as shown in FIG. 6C, the ruthenium liner 308 is deposited over the dielectric layer 222 as well. In some implementations, as described in connection with FIG. 4C, the deposition tool 102 deposits the ruthenium liner 308 for an amount of time in a range from approximately 1 minute to approximately 10 minutes. In implementation 600, the ruthenium liner 308 is used in combination with the barrier layer 310. In other implementations, the ruthenium liner 308 is used without the barrier layer 310 in order to further reduce contact resistance between conductive structure 244 and conductive structure 248. In other implementations, the barrier layer 310 is used without the ruthenium liner 308 in order to further reduce sheet resistance of conductive structure 248. In such implementations, the barrier layer 310 may be doped with ruthenium in order to reduce surface scattering of conductive structure 248. For example, the ion implantation tool 114 may dope the barrier layer 310 with ruthenium ions.

Figure 6D:
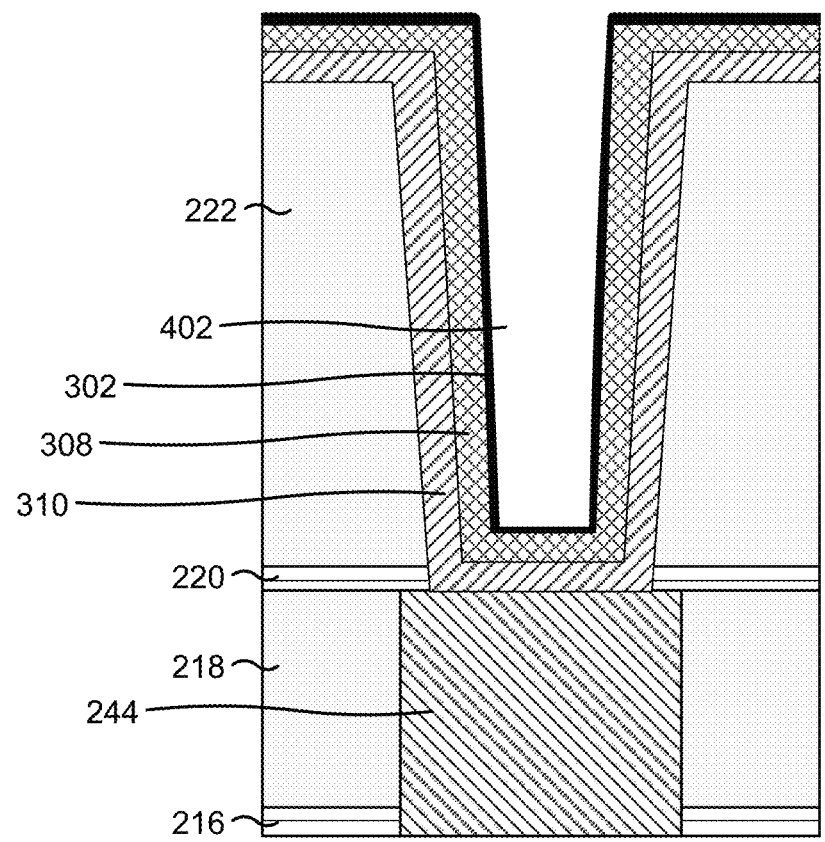

As shown in FIG. 6D, a graphene liner 302 may be formed over the ruthenium liner 308. The deposition tool 102 may deposit the graphene liner 302 by a CVD technique, a PVD technique, an ALD technique, or another type of deposition technique. In some implementations, and as shown in FIG. 6D, the graphene liner 302 is deposited over the dielectric layer 222 as well. In some implementations, as described in connection with FIG. 4E, a ratio of a deposition time associated with the graphene liner 302 to a deposition time associated with the barrier layer 310 or the ruthenium liner 308 is in a range from approximately one to approximately two. For example, the deposition tool 102 deposits the graphene liner 302 for an amount of time in a range from approximately 4 minutes to approximately 18 minutes.

Accordingly, a bi-layer liner is formed with a first layer including the graphene layer 302 and a second layer including the ruthenium liner 308 and the barrier layer 310.

Figure 6E:
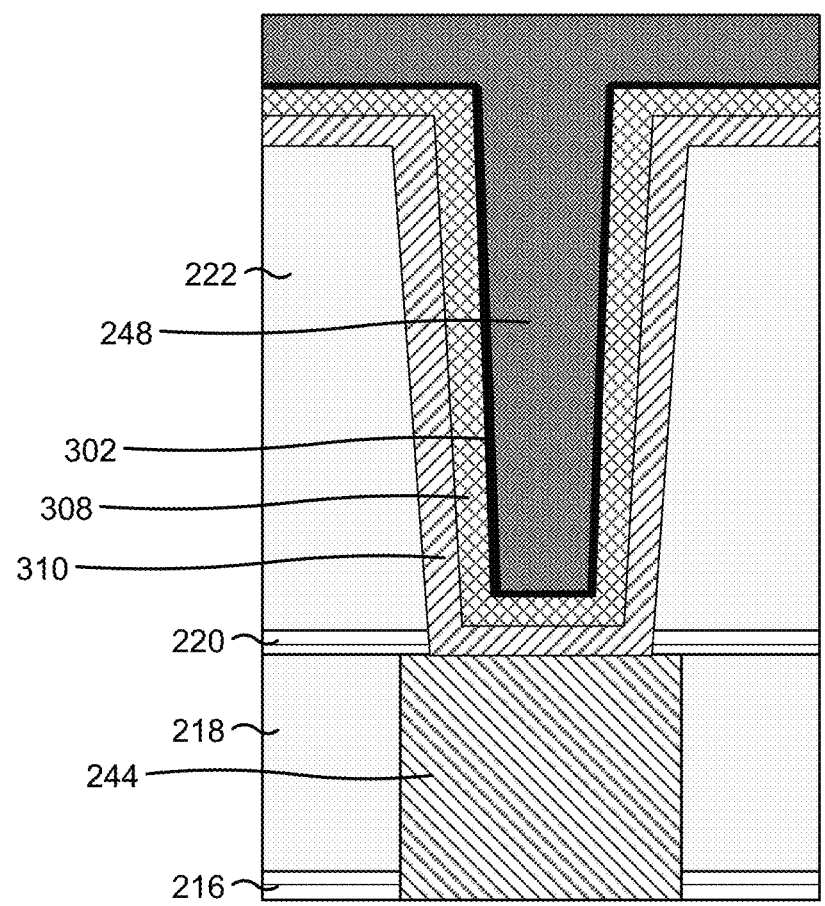

As shown in FIG. 6E, the conductive structure 248 may be formed in the recess 402 and over the graphene liner 302. The deposition tool 102 may deposit the copper of the conductive structure 248 using a CVD technique, a PVD technique, an ALD technique, or another type of deposition technique, the plating tool 112 may deposit the copper of the conductive structure 248 using an electroplating operation, or a combination thereof. In some implementations, and as shown in FIG. 6E, the copper flows over the dielectric layer 222 as well as into the recess 402. As described herein, the graphene liner 302 reduces surface scattering of the conductive structure 248 by improving flow of the copper into the recess 402.

Figure 6F:
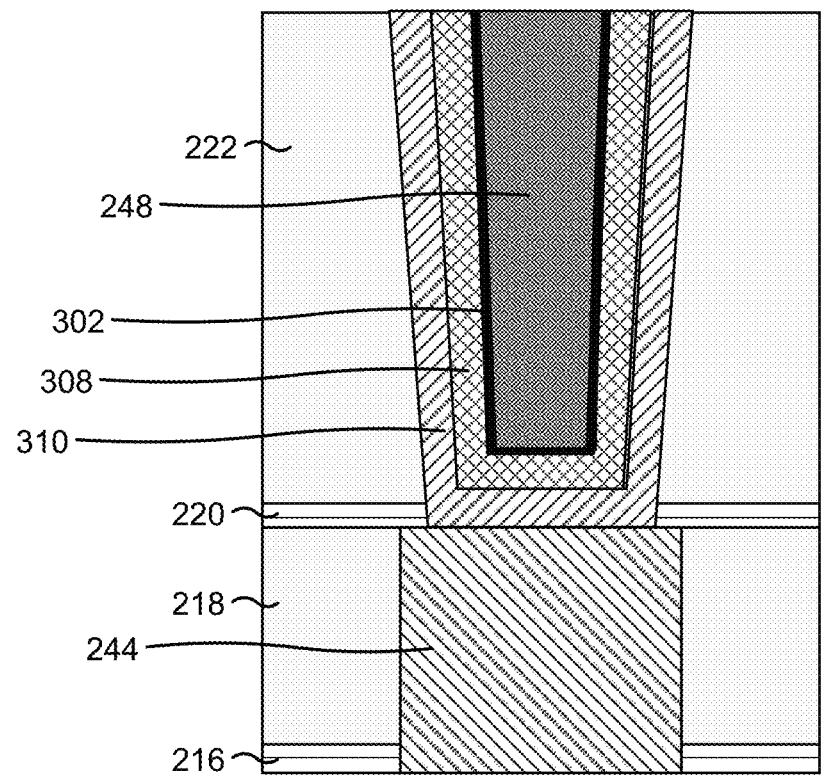

As shown in FIG. 6F, the conductive structure 248 may be planarized. The planarization tool 110 may planarize the conductive structure 248 after the conductive structure 248 is deposited. Additionally, portions of barrier layer 310 and/or ruthenium liner 308 deposited over the dielectric layer 222 may be removed during planarization.

Figure 6G:
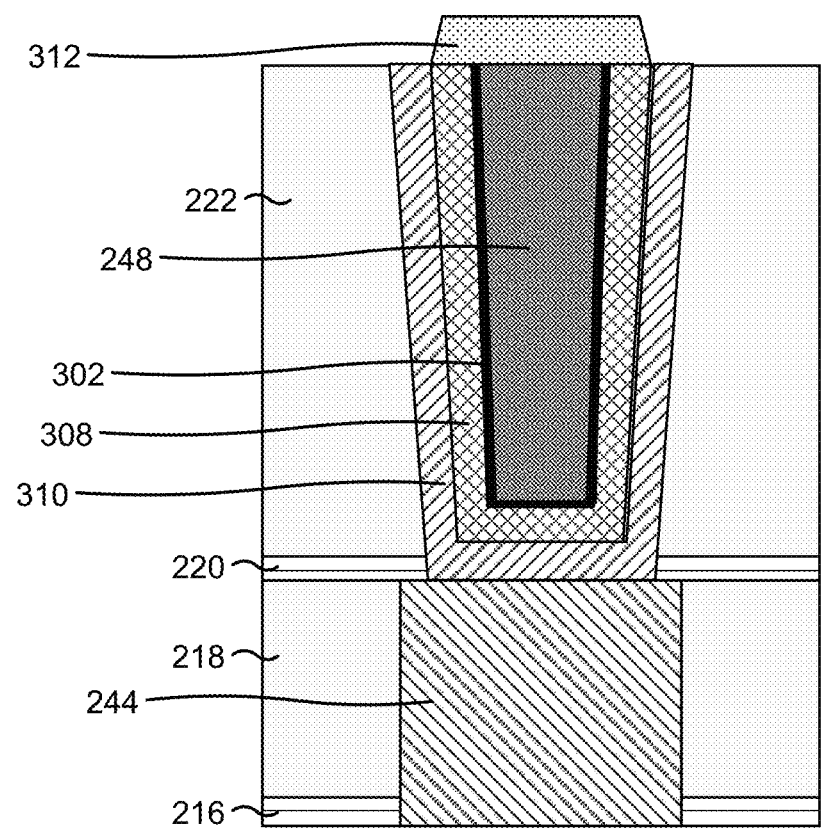

As shown in FIG. 6G, a cobalt cap 312 may be formed on a top surface of the conductive structure 248. In implementation 600, a top surface of the cobalt cap 312 extends above a top surface of the dielectric layer 222. Additionally, or alternatively, and as described in connection with FIG. 4H, a bottom surface of the cobalt cap 312 may extend below a top surface of the dielectric layer 222. In implementation 600, the cap 312 is cobalt. In other implementations, the cap 312 includes a ruthenium-cobalt alloy in order to reduce migration of cobalt atoms from the cap 312. In other implementations, the cap 312 includes ruthenium without cobalt to further reduce migration of cobalt atoms from the cap 312.

In some implementations, the cobalt cap 312 may be selectively deposited over the conductive structure 248 but not the dielectric layer 222 by using an organic precursor. Accordingly, a cleaning tool may remove the organic precursor from the conductive structure 248 and/or the dielectric layer 222 using a plasma.

Figure 6H:
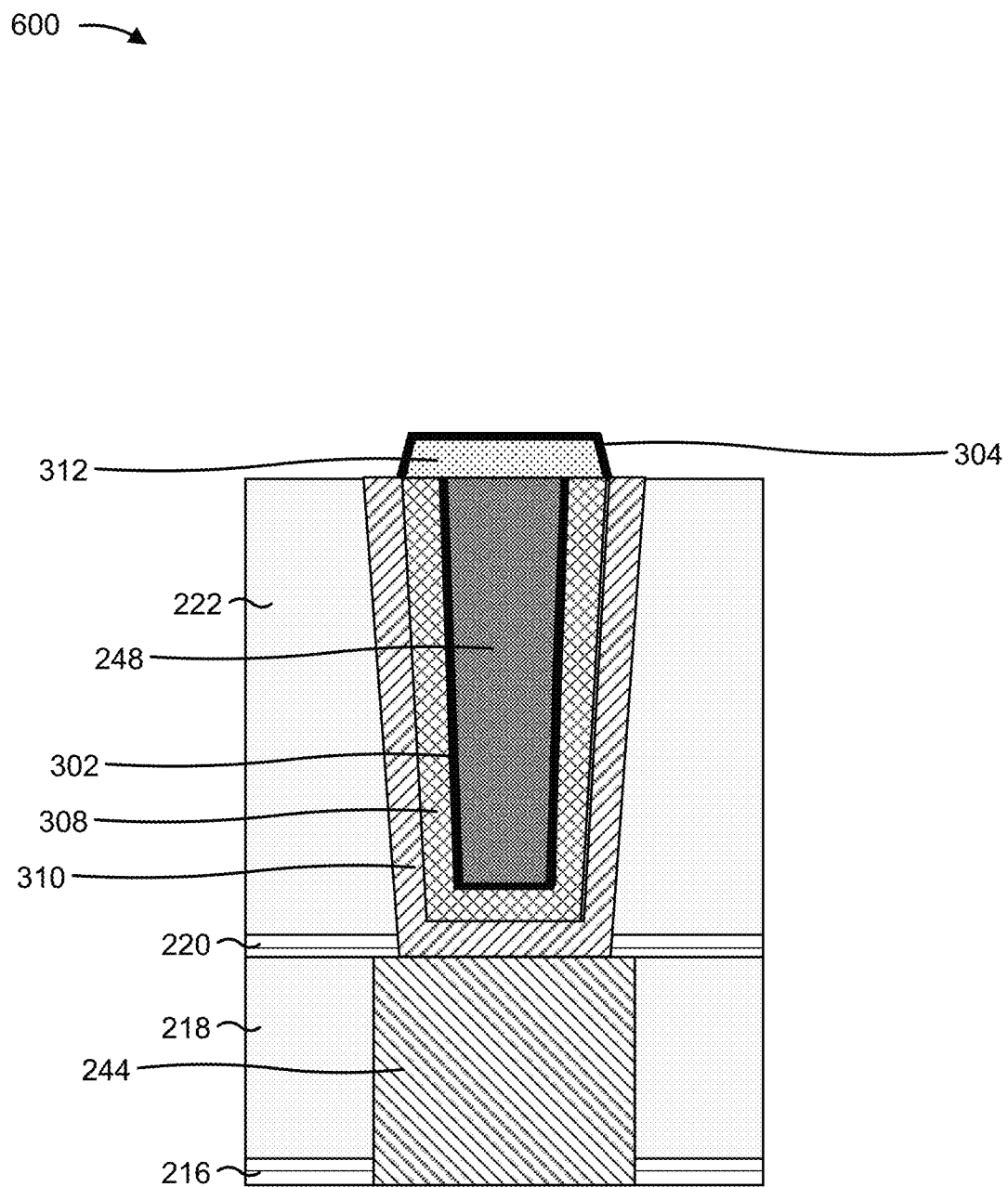

As shown in FIG. 6H, a graphene cap 304 may be formed over the cobalt cap 312. The deposition tool 102 may deposit the graphene cap 304 by a CVD technique, a PVD technique, an ALD technique, or another type of deposition technique. In some implementations, as described in connection with FIG. 4I, a ratio of a deposition time associated with the graphene cap 304 to a deposition time associated with the barrier layer 310, the ruthenium liner 308, or the cobalt liner 306 is in a range from approximately one to approximately two. For example, the deposition tool 102 deposits the graphene cap 304 for an amount of time in a range from approximately 4 minutes to approximately 18 minutes.

In some implementations, the graphene cap 304 may be selectively deposited over the cobalt cap 312 but not the dielectric layer 222 by using a hydrocarbon-based precursor. Accordingly, the dielectric layer 222 may include hydrocarbon residue that is a byproduct of depositing the graphene cap 304.

Accordingly, a bi-layer cap is formed with a first layer including the graphene cap 304 and a second layer including the cobalt cap 312.

Figure 6I:
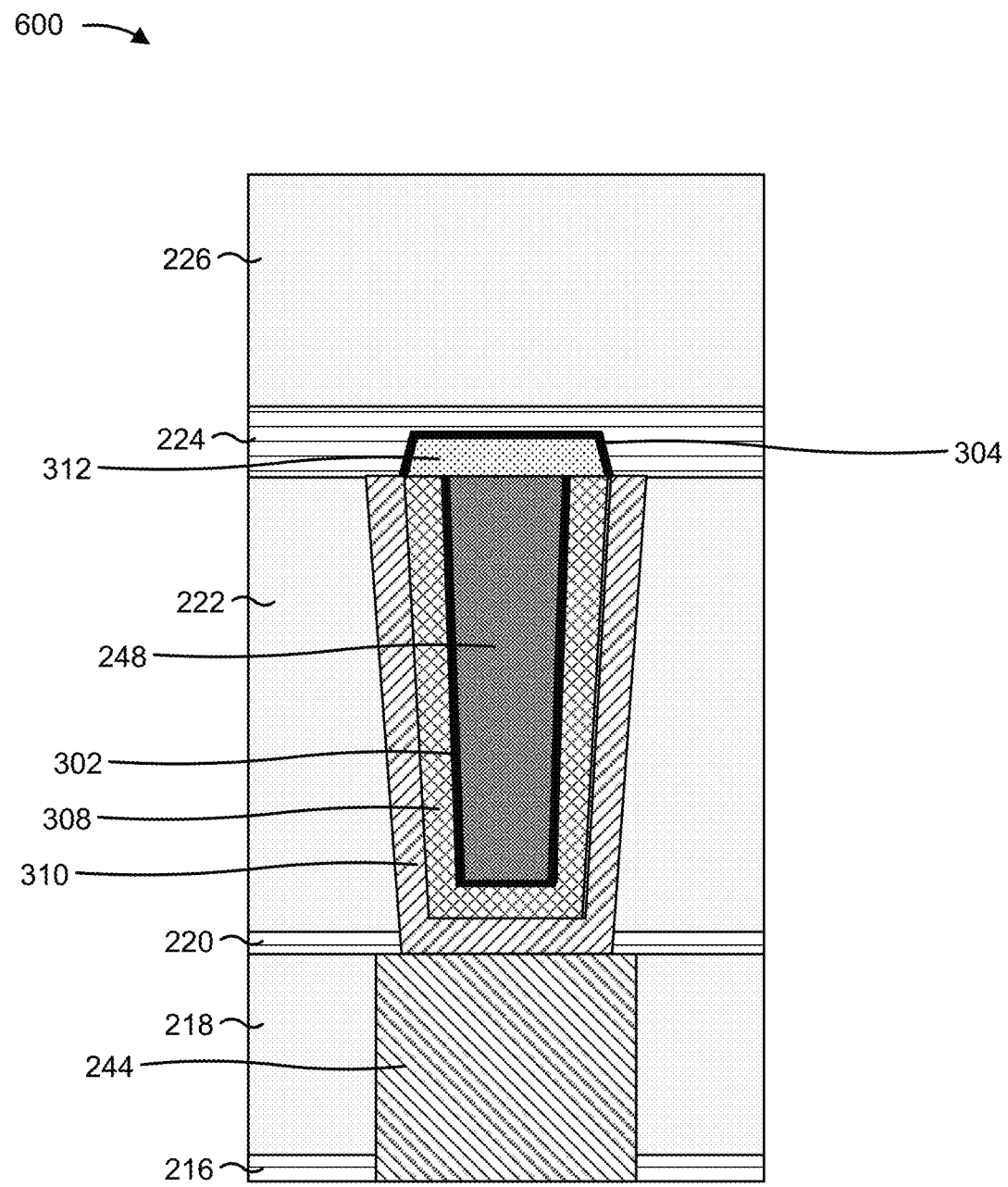

As shown in FIG. 6I, ESL 224 may be formed over the dielectric layer 222 and the conductive structure 248. The deposition tool 102 may deposit the ESL 224 by a CVD technique, a PVD technique, an ALD technique, or another type of deposition technique. The planarization tool 110 may planarize the ESL 224 after the ESL 224 is deposited.

Additionally, a dielectric layer 226 may be formed over the ESL 224. For example, the deposition tool 102 may deposit the dielectric layer 226 by a CVD technique, a PVD technique, an ALD technique, or another type of deposition technique. The planarization tool 110 may planarize the dielectric layer 226 after the dielectric layer 226 is deposited.

Figure 6J:
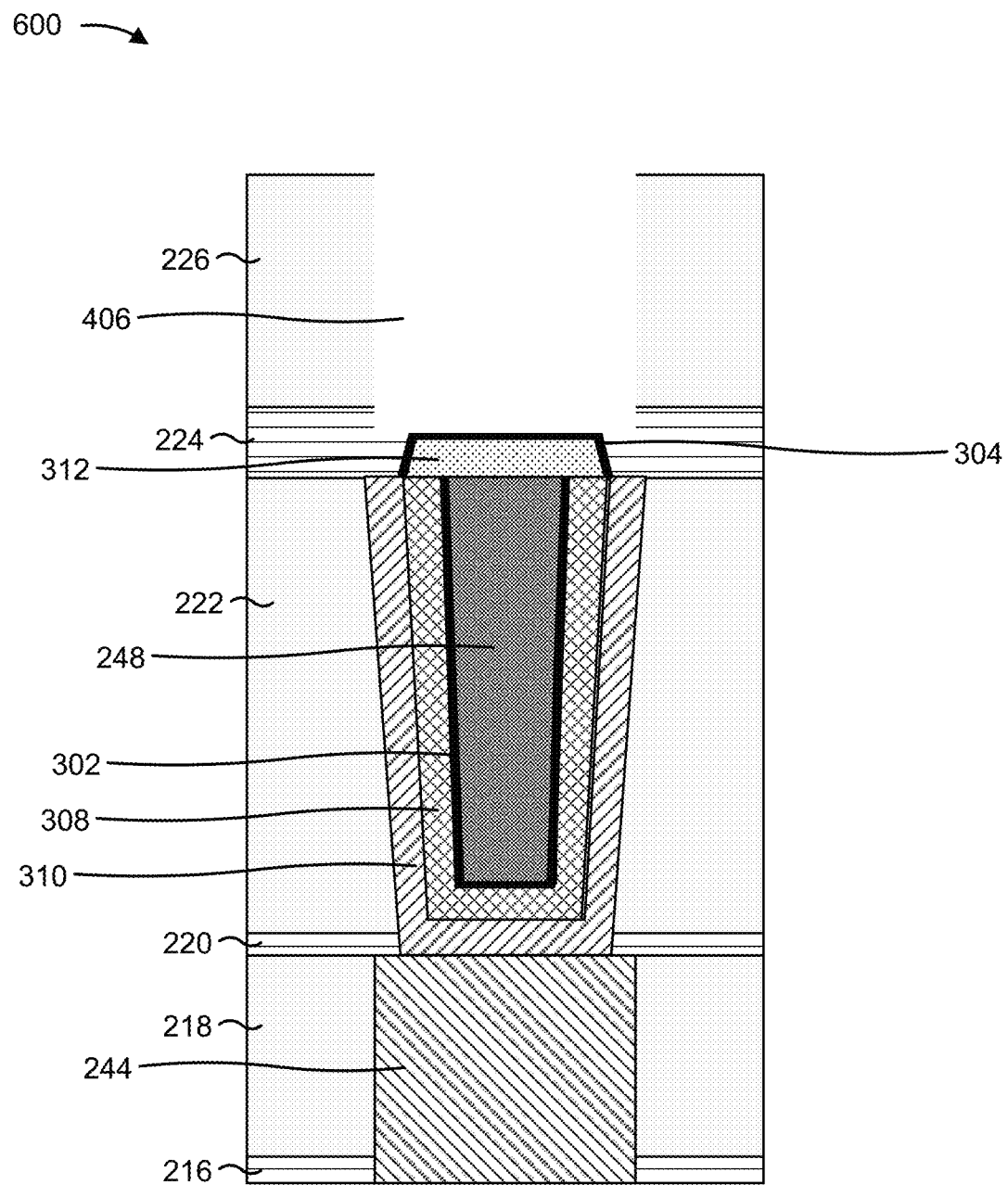

As shown in FIG. 6J, the dielectric layer 226 may be etched to form an opening (resulting in recess 406) such that the graphene cap 304 is at least partially exposed. For example, the deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 226 to form the recess 406. In some implementations, a photoresist removal tool removes the remaining portions of the photoresist layer (e.g., using a chemical stripper, a plasma asher, and/or another technique) after the etch tool 108 etches the recess 406.

Figure 6K:
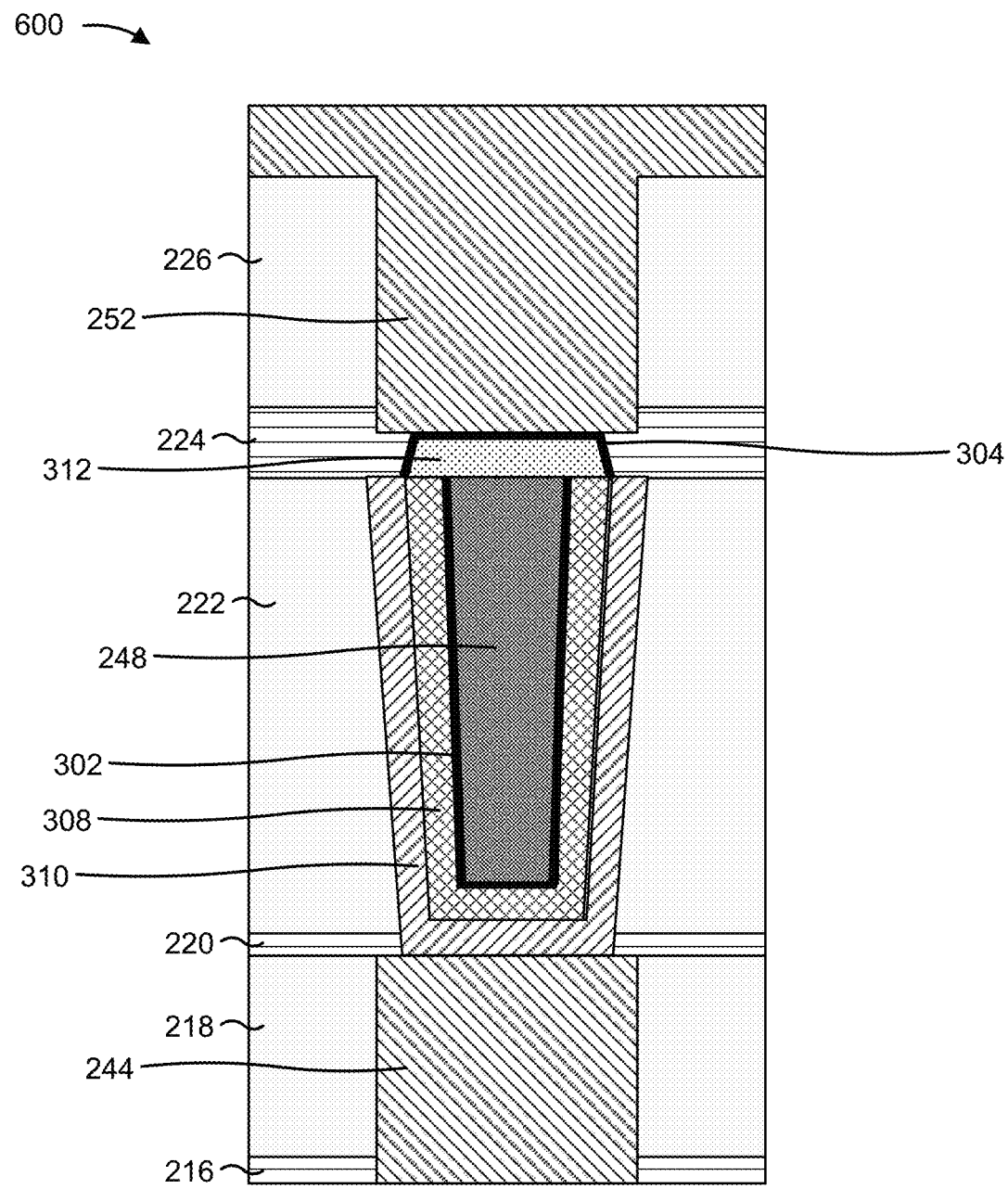

As shown in FIG. 6K, the conductive structure 252 may be formed in the recess 406 and over the graphene cap 304. The deposition tool 102 may deposit the copper of the conductive structure 252 using a CVD technique, a PVD technique, an ALD technique, or another type of deposition technique, the plating tool 112 may deposit the copper of the conductive structure 252 using an electroplating operation, or a combination thereof. In some implementations, and as shown in FIG. 6K, the copper flows over the dielectric layer 226 as well as into the recess 406. As described herein, the graphene cap 304 reduces surface scattering between the conductive structure 252 and the cobalt cap 312.

Figure 6L:
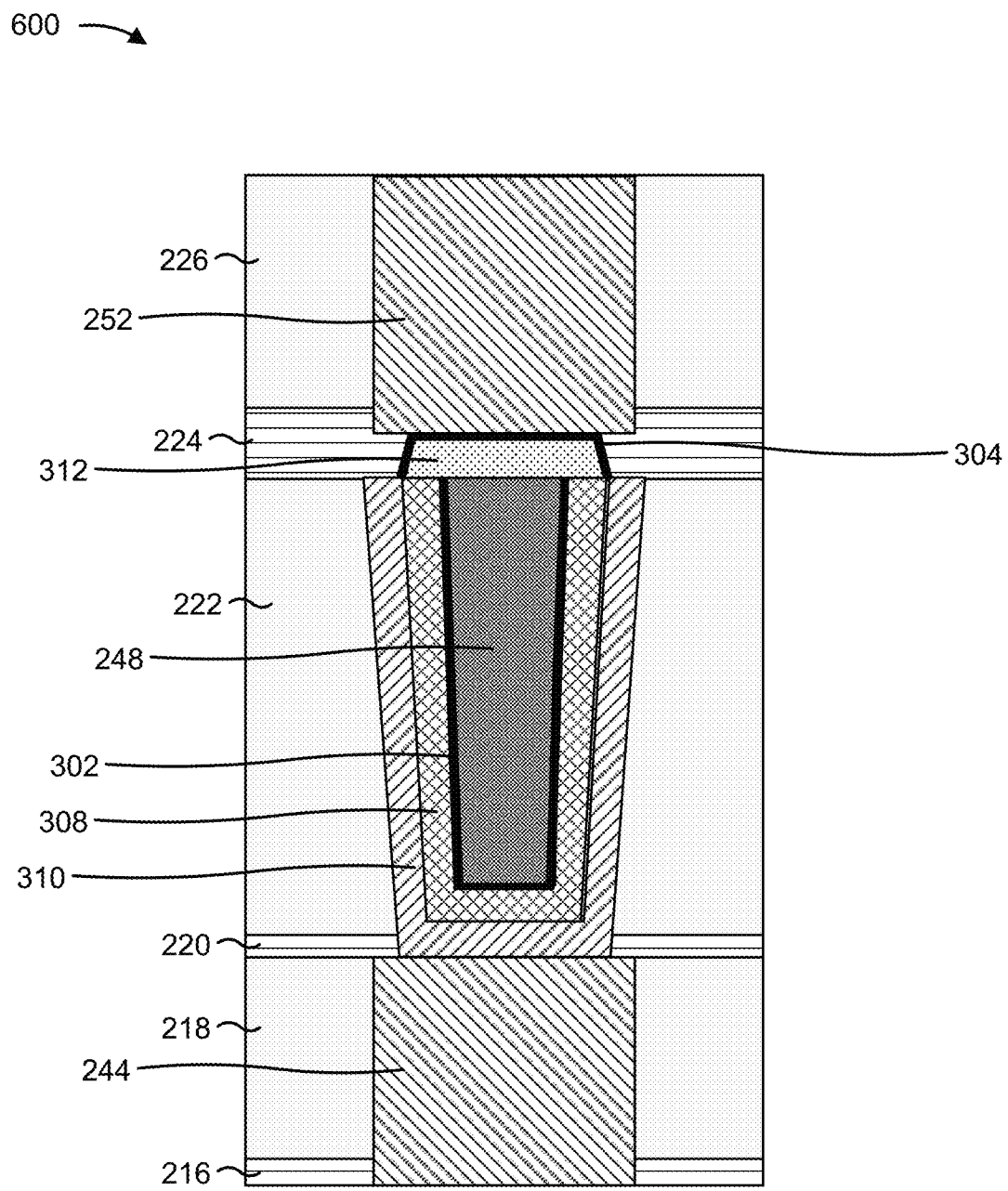

As shown in FIG. 6L, the conductive structure 252 may be planarized. The planarization tool 110 may planarize the conductive structure 252 after the conductive structure 252 is deposited.

Although described with respect to forming conductive structure 248, the description similarly applies forming an M0 metallization layer (e.g., conductive structure 244) and/or higher metallization layers (e.g., an M1 metallization layer, such as conductive structure 252). Similarly, although described with respect to forming the conductive structure 248 above a source or drain contact 230, the description similarly applies to forming a conductive structure above a gate contact 242 (e.g., conductive structure 240, conductive structure 246, via 250, and/or conductive structure 254, among other examples).

By using techniques as described in connection with FIGS. 6A-6L, the barrier layer 310 and the ruthenium liner 308 prevent diffusion of copper from the conductive structure 248, which reduces resistivity of the conductive structure 248, while the graphene liner 302 reduces surface scattering of the conductive structure 248. Similarly, the cobalt cap 312 prevents diffusion of copper from the conductive structure 248, which reduces resistivity of the conductive structure 248, while the graphene cap 304 reduces surface scattering between the cobalt cap 312 and the conductive structure 252.

As indicated above, FIGS. 6A-6L are provided as one or more examples. Other examples may differ from what is described with regard to FIGS. 6A-6L. For example, in some implementations, the barrier layer 310 or the ruthenium liner 308 may be omitted. Additionally, or alternatively, the graphene liner 302 may be implemented without the graphene cap 304, or the graphene cap 304 may be implemented without the graphene liner 302.

Figure 7:
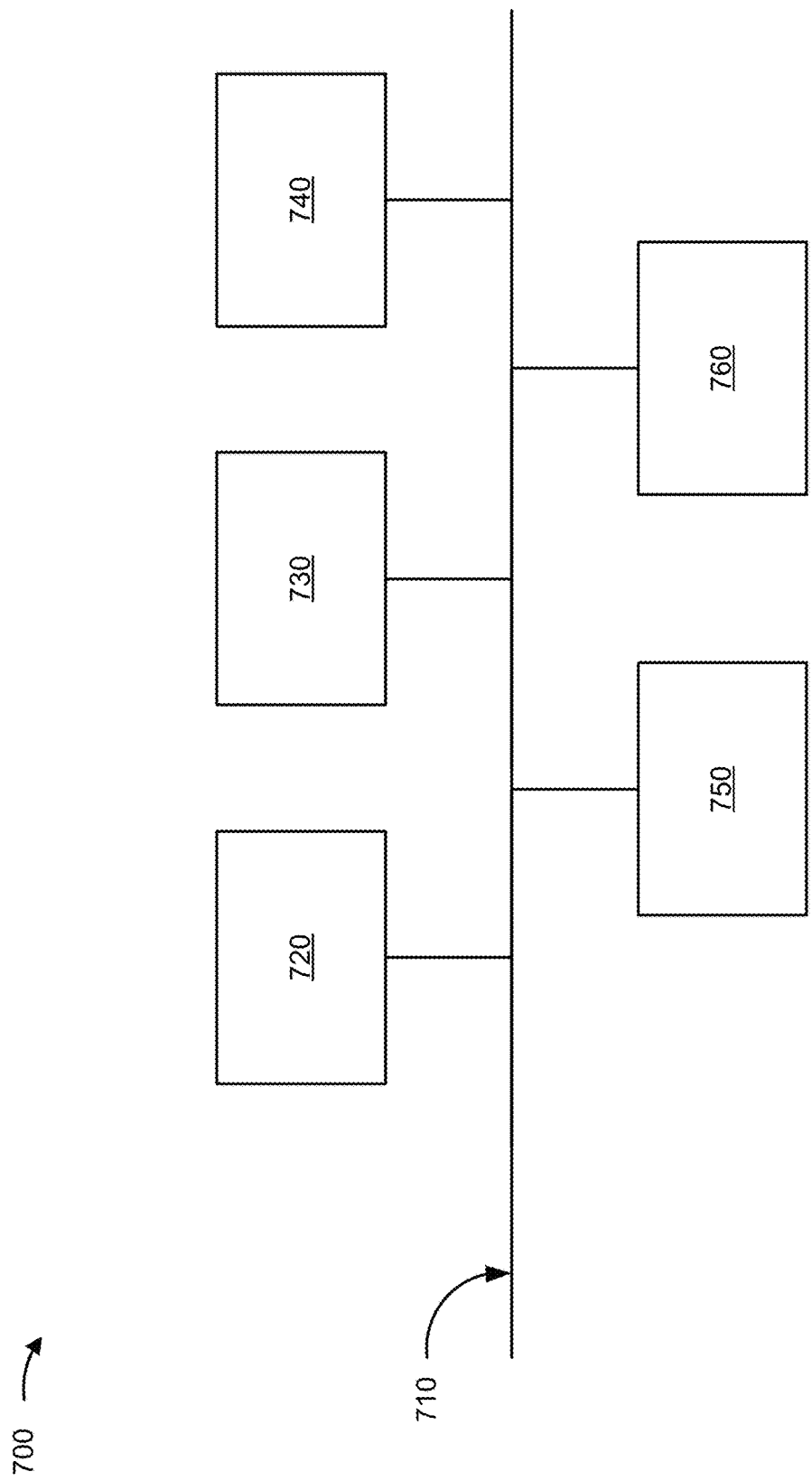
FIG. 7 is a diagram of example components of one or more devices of FIG. 1 described herein.

FIG. 7 is a diagram of example components of a device 700. In some implementations, one or more of the semiconductor processing tools 102-114 and/or the wafer/die transport tool 116 may include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry may be used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
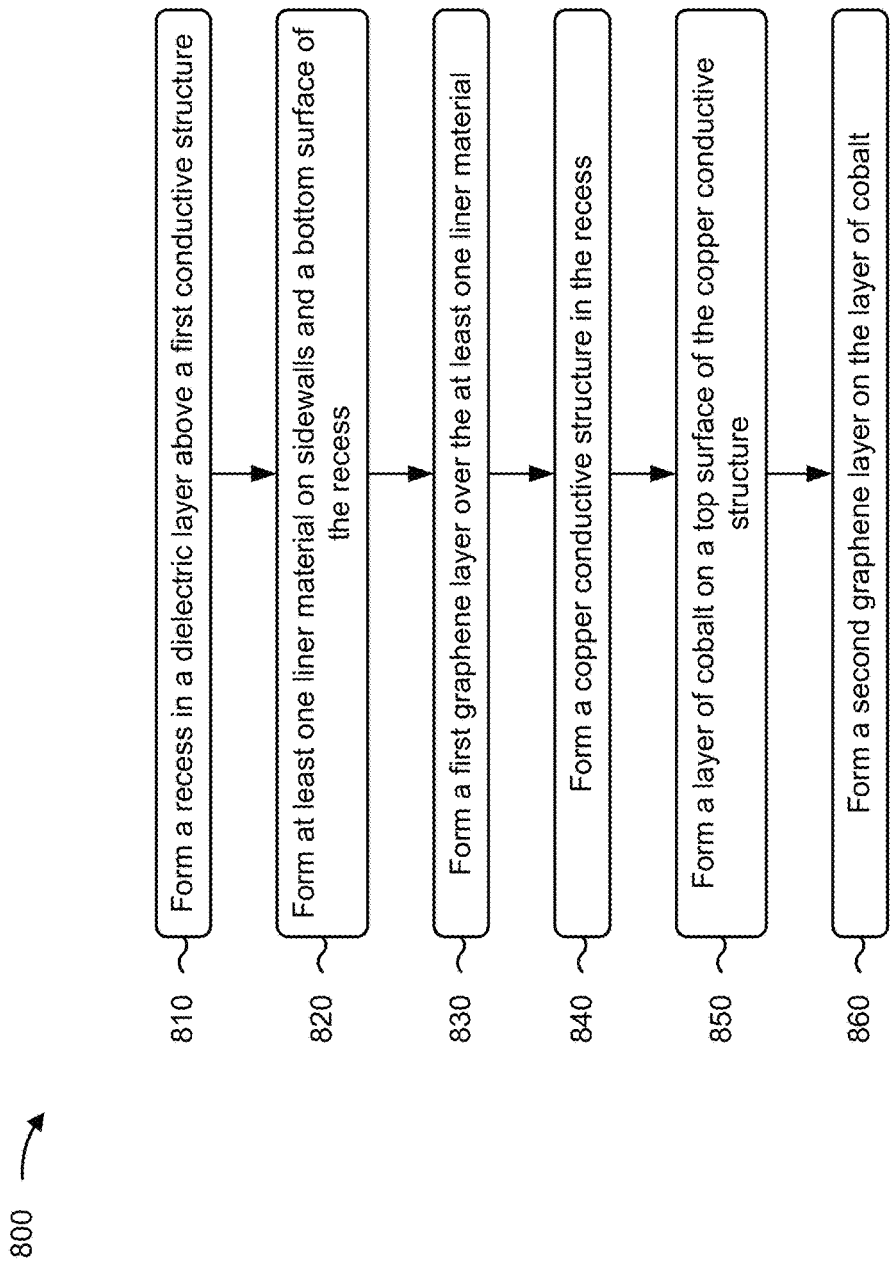
FIG. 8 is a flowchart of an example process relating to forming a semiconductor structure described herein.

FIG. 8 is a flowchart of an example process 800 associated with forming a graphene liner and/or cap to reduce surface scattering and/or contact resistance. In some implementations, one or more process blocks of FIG. 9 may be performed by one or more semiconductor processing tools (e.g., one or more of the semiconductor processing tools 102-114). Additionally, or alternatively, one or more process blocks of FIG. 9 may be performed by one or more components of device 700, such as processor 720, memory 730, input component 740, output component 750, and/or communication component 760.

As shown in FIG. 8, process 800 may include forming a recess in a dielectric layer above a first conductive structure (block 810). For example, the one or more semiconductor processing tools 102-114 may form a recess 402 in a dielectric layer 222 above a first conductive structure 244, as described herein.

As further shown in FIG. 8, process 800 may include forming at least one liner material on sidewalls and a bottom surface of the recess (block 820). For example, the one or more semiconductor processing tools 102-114 may form at least one liner material 308 and/or 310 on sidewalls and a bottom surface of the recess 402, as described herein.

As further shown in FIG. 8, process 800 may include forming a first graphene layer over the at least one liner material (block 830). For example, the one or more semiconductor processing tools 102-114 may form a first graphene layer 302 over the at least one liner material 308 and/or 310, as described herein.

As further shown in FIG. 8, process 800 may include forming a copper conductive structure in the recess (block 840). For example, the one or more semiconductor processing tools 102-114 may form a copper conductive structure 248 in the recess 402, as described herein.

As further shown in FIG. 8, process 800 may include forming a layer of cobalt on a top surface of the copper conductive structure (block 850). For example, the one or more semiconductor processing tools 102-114 may form a layer of cobalt 312 on a top surface of the copper conductive structure 248, as described herein.

As further shown in FIG. 8, process 800 may include forming a second graphene layer on the layer of cobalt (block 860). For example, the one or more semiconductor processing tools 102-114 may form a second graphene layer 304 on the layer of cobalt 312, as described herein.

Process 800 may include additional implementations, such as any single implementation or any combination of implementations described below and/or in connection with one or more other processes described elsewhere herein.

In a first implementation, the layer of cobalt 312 is selectively deposited using an organic precursor, and process 800 further includes removing the organic precursor using plasma after depositing the layer of cobalt 312.

In a second implementation, alone or in combination with the first implementation, the second graphene layer 304 is selectively deposited using a precursor comprising hydrocarbons.

In a third implementation, alone or in combination with one or more of the first and second implementations, process 800 further includes planarizing the copper conductive structure 248 before forming the layer of cobalt.

In a fourth implementation, alone or in combination with one or more of the first through third implementations, a ratio of an amount of time associated with depositing the first graphene layer 302 to an amount of time associated with depositing the at least one liner material 308 and/or 310 is in a range from approximately one to approximately two.

In a fifth implementation, alone or in combination with one or more of the first through fourth implementations, forming the at least one liner material includes forming a first layer 308 including a nitride, and forming a second layer 310 including ruthenium.

In a sixth implementation, alone or in combination with one or more of the first through fourth implementations, forming the at least one liner material includes forming a layer 308 including a nitride, and doping the layer of nitride with ruthenium.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a bi-layer liner including a graphene layer and at least one liner material (e.g., barrier layer, ruthenium liner, and/or cobalt liner) formed adjacent to a copper conductive structure reduces surface scattering at an interface between the at least one liner material and the copper conductive structure. Additionally, or alternatively, the graphene reduces contact resistance at an interface between the at least one liner material and the copper conductive structure. A bi-layer cap including a graphene layer and a metal layer may additionally or alternatively be formed over the copper conductive structure to reduce surface scattering at an interface between the metal layer and an additional copper conductive structure deposited over the metal layer.

As described in greater detail above, some implementations described herein provide a semiconductor structure. The semiconductor structure includes a copper conductive structure formed in a dielectric layer and below at least one ESL. The semiconductor structure further includes a bi-layer liner adjacent to the copper conductive structure, wherein the bi-layer liner comprises a first layer of graphene adjacent to the copper conductive structure and a second layer adjacent to the first layer and at an interface between the copper conductive structure and a first conductive structure below the copper conductive structure.

As described in greater detail above, some implementations described herein provide a method. The method includes forming a recess in a dielectric layer above a first conductive structure. The method further includes forming at least one liner material on sidewalls and a bottom surface of the recess. The method includes forming a first graphene layer over the at least one liner material. The method further includes forming a copper conductive structure in the recess. The method includes forming a layer of cobalt on a top surface of the copper conductive structure. The method further includes forming a second graphene layer on the layer of cobalt.

As described in greater detail above, some implementations described herein provide a semiconductor structure. The semiconductor structure includes a copper conductive structure formed in a dielectric layer and below at least ESL. The semiconductor structure further includes at least one liner material adjacent to sidewalls of the copper conductive structure and at an interface between the copper conductive structure and a first conductive structure below the copper conductive structure. The semiconductor structure includes a bi-layer cap at an interface between the copper conductive structure and a second conductive structure above the copper conductive structure, wherein the bi-layer cap comprises a first layer adjacent to the copper conductive structure and a second layer of graphene adjacent to the first layer and at the interface between the copper conductive structure and the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a copper conductive structure formed in a dielectric layer and below at least one etch stop layer (ESL); and
    a bi-layer liner adjacent to the copper conductive structure, where in the bi-layer liner comprises a first layer of graphene adjacent to the copper conductive structure and a second layer adjacent to the first layer and at an interface between the copper conductive structure and a first conductive structure below the copper conductive structure,
    wherein a ratio of a thickness of the second layer to a thickness of the first layer of graphene is in a range from approximately two to approximately twenty.

2. The semiconductor structure of claim 1, wherein the first layer of graphene comprises no more than seven two-dimensional sheets of carbon atoms and has a thickness of no more than 20 Angstroms (Å).

3. The semiconductor structure of claim 1, wherein the second layer comprises ruthenium, a nitride, or a combination thereof.

4. The semiconductor structure of claim 1, wherein the second layer comprises a nitride doped with ruthenium.

5. The semiconductor structure of claim 1, further comprising:
    a cobalt liner adjacent to the second layer.

6. The semiconductor structure of claim 1, further comprising:
    an additional layer of graphene at an interface between the copper conductive structure and a second conductive structure above the copper conductive structure.

7. The semiconductor structure of claim 6, further comprising:
    a cap layer of cobalt at an interface between the copper conductive structure and a second conductive structure above the copper conductive structure, wherein a top surface of the layer of cobalt extends above a top surface of the dielectric layer.

8. The semiconductor structure of claim 6, further comprising:
    a cap layer of cobalt at an interface between the copper conductive structure and a second conductive structure above the copper conductive structure, wherein a bottom surface of the layer of cobalt extends below a top surface of the dielectric layer.

9. The semiconductor structure of claim 1, wherein the second layer comprises a ruthenium liner.

10. The semiconductor structure of claim 1, wherein the second layer comprises a cobalt liner.

11. A method, comprising:
    forming a recess in a dielectric layer above a first conductive structure;
    forming at least one liner material on sidewalls and a bottom surface of the recess;
    forming a first graphene layer over the at least one liner material;
    forming a copper conductive structure in the recess;
    selectively depositing a layer of cobalt on a top surface of the copper conductive structure using an organic precursor;
    removing the organic precursor using plasma after depositing the layer of cobalt; and
    forming a second graphene layer on the layer of cobalt.

12. The method of claim 11, wherein the second graphene layer is selectively deposited using a precursor comprising hydrocarbons.

13. The method of claim 11, further comprising:
    planarizing the copper conductive structure before forming the layer of cobalt.

14. The method of claim 11, wherein a ratio of an amount of time associated with depositing the first graphene layer to an amount of time associated with depositing the at least one liner material is in a range from approximately one to approximately two.

15. The method of claim 11, wherein forming the at least one liner material comprises:
    forming a first layer including a nitride; and
    forming a second layer including ruthenium.

16. The method of claim 11, wherein forming the at least one liner material comprises:
    forming a layer including a nitride; and
    doping the layer of nitride with ruthenium.

17. A semiconductor structure, comprising:
    a copper conductive structure formed in a dielectric layer and below at least one etch stop layer (ESL);
    at least one liner material adjacent to sidewalls of the copper conductive structure and at an interface between the copper conductive structure and a first conductive structure below the copper conductive structure;
    a bi-layer cap at an interface between the copper conductive structure and a second conductive structure above the copper conductive structure, wherein the bi-layer cap comprises a first layer adjacent to the copper conductive structure and a second layer of graphene adjacent to the first layer and at the interface between the copper conductive structure and the second conductive structure; and
    an additional layer of graphene adjacent to the copper conductive structure.

18. The semiconductor structure of claim 17, wherein a ratio of a thickness of the first layer to a thickness of the at least one liner material is in a range from approximately 0.2 to approximately 1.4.

19. The semiconductor structure of claim 17, wherein a ratio of a thickness of the dielectric layer to a thickness of the at least one ESL is in a range from approximately two to approximately four.

20. The semiconductor structure of claim 17, wherein the additional layer of graphene comprises a graphene liner.

* * * * *